(12) United States Patent
Yamakura et al.

(10) Patent No.: US 6,373,458 B1
(45) Date of Patent: Apr. 16, 2002

(54) MOTION CIRCUIT AND ON-BOARD DRIVER CIRCUIT FOR LIQUID CRYSTAL DISPLAY PANEL EMPLOYING THE MOTION CIRCUIT

(75) Inventors: Makoto Yamakura, Moriguchi; Katsumi Adachi, Kashiba, both of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/432,605

(22) Filed: Nov. 3, 1999

(30) Foreign Application Priority Data

Nov. 4, 1998 (JP) .......................................... 10-313753
Oct. 21, 1999 (JP) .......................................... 11-300232

(51) Int. Cl.$^7$ ................................................ G09G 3/36
(52) U.S. Cl. ........................................ 345/98; 345/100
(58) Field of Search ........................... 345/98, 100, 87, 345/96; 257/59, 66, 72, 350

(56) References Cited

U.S. PATENT DOCUMENTS 6,274,888 B1 * 8/2001 Suzuki et al. ................. 257/72
6,275,210 B1 * 8/2001 Maekawa .................... 345/98

* cited by examiner

Primary Examiner—Amare Mengistu
(74) Attorney, Agent, or Firm—Parkhurst & Wendel, LLP

(57) ABSTRACT

The motion circuit of the present invention is an on-board driver circuit which is composed of polycrystal silicon semiconductor layers formed on a substrate, and which is provided with a first latch circuit for latching one of a normal phase and reverse phase clock signals having a clock skew using a clock signal and for outputting it to a shift register, and a second latch circuit for latching the other one of the normal phase and reverse phase clock signals using a clock signal and for outputting to the shift register. The latch operations of the first and second latch circuits are timed to make the two clock signals have reverse polarities. Consequently, it is realized to provide a motion circuit performing stable circuit operations without malfunctions, by preventing the occurrence of the fail phenomenon due to a skew between the normal phase and reverse phase clock signals which drive the shift register. It is also realized to provide an on-board driver circuit for a liquid crystal display panel by employing the motion circuit.

49 Claims, 26 Drawing Sheets

FIG. 2
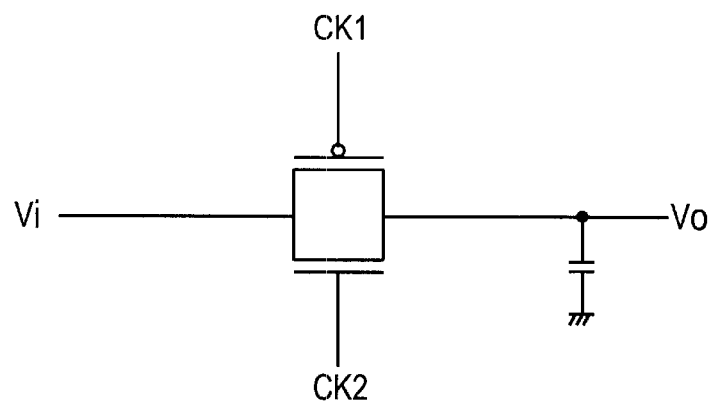
FIG. 3(a) CLOCK SIGNAL A 
FIG. 3(b) CLOCK SIGNAL B 
FIG. 3(c) START SIGNAL S 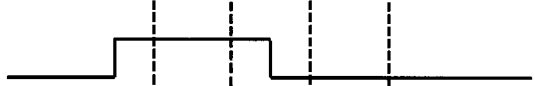
FIG. 3(d) OUTPUT TERMINAL a1 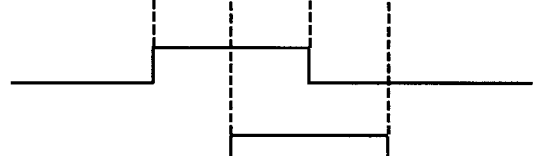
FIG. 3(e) OUTPUT TERMINAL a2 

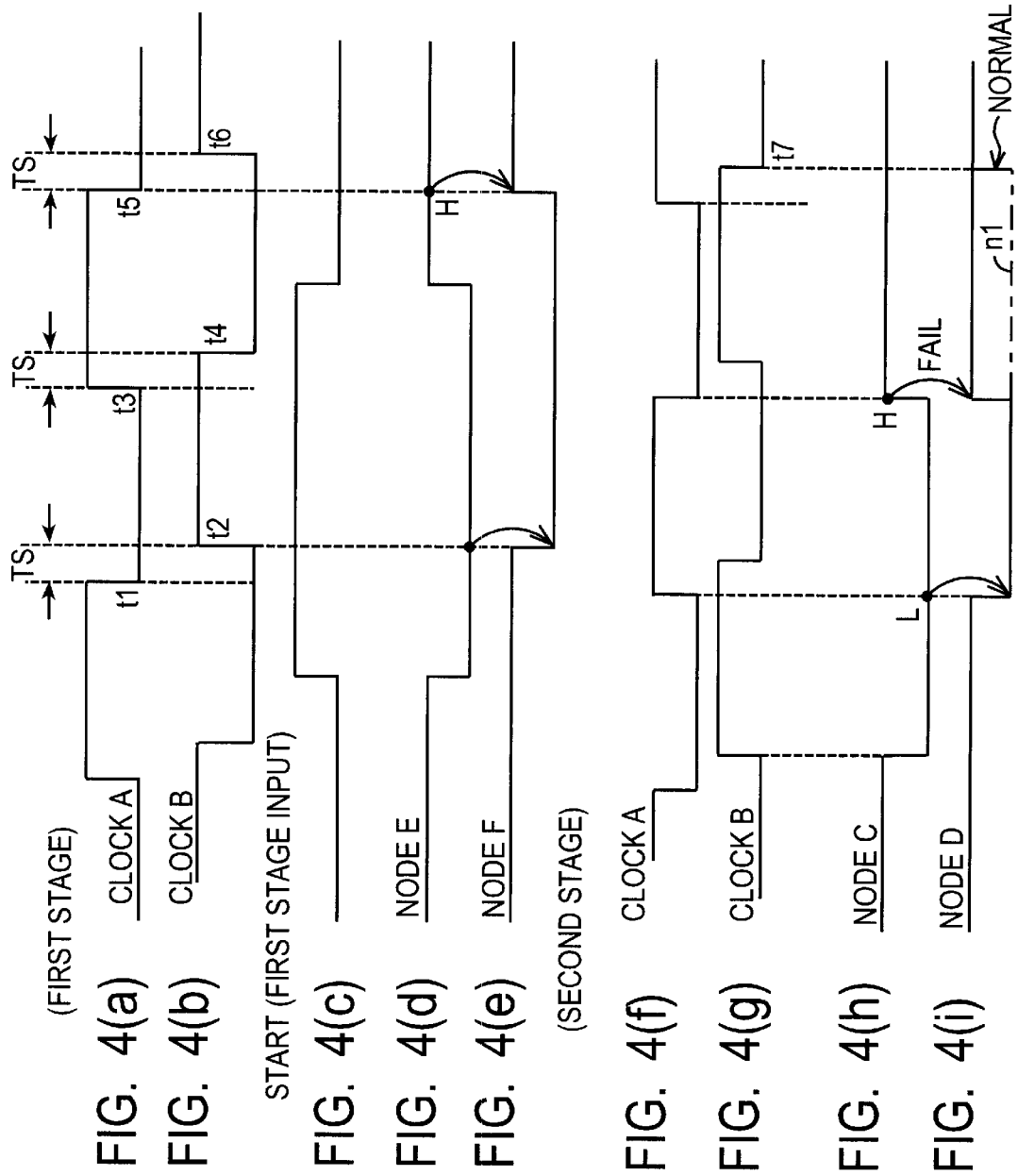

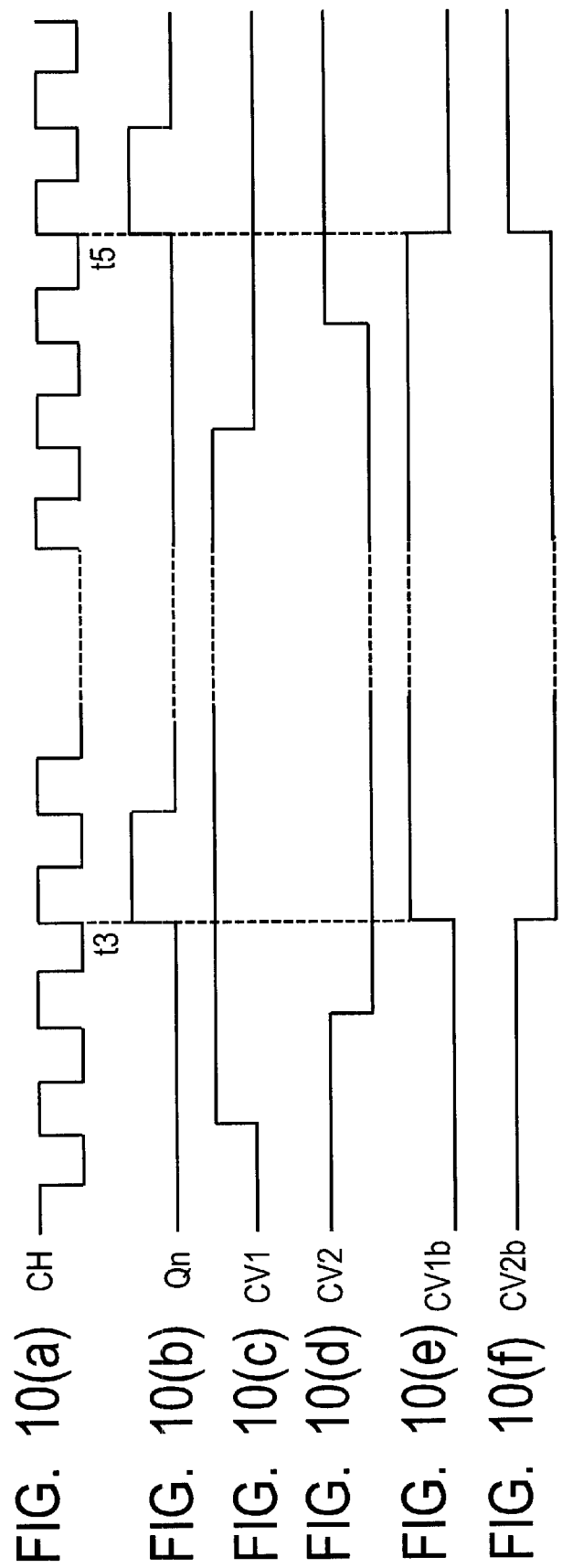

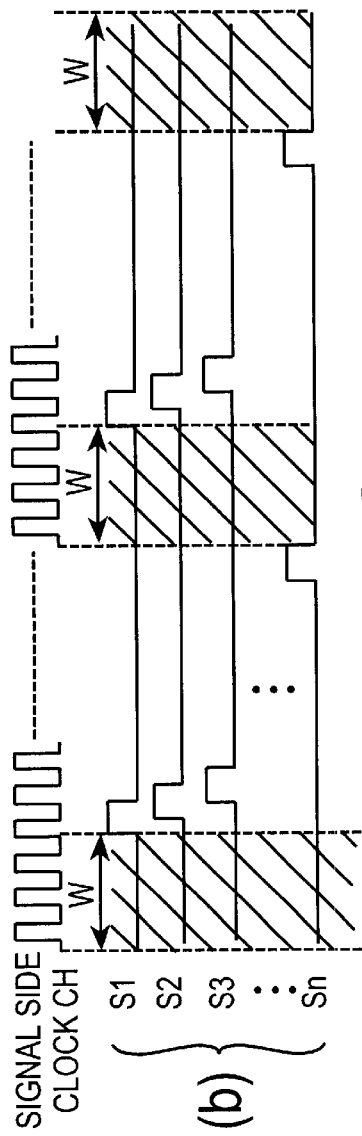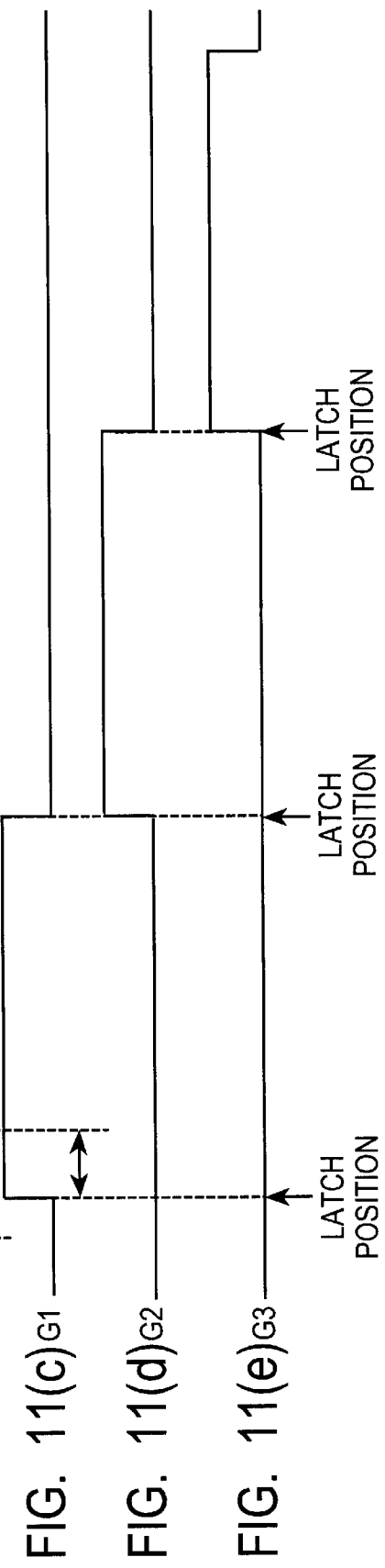

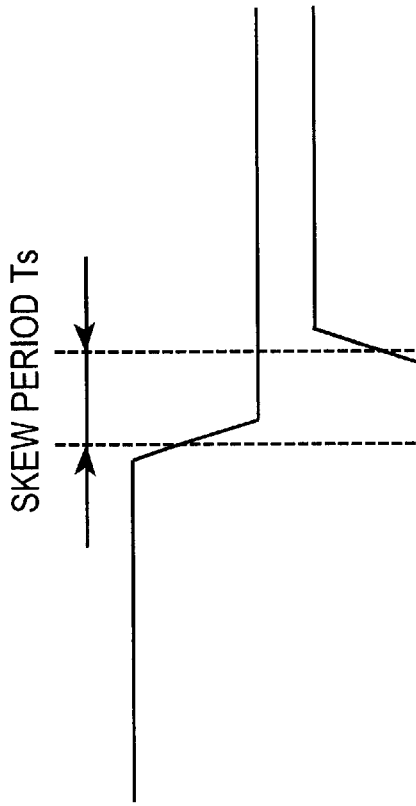
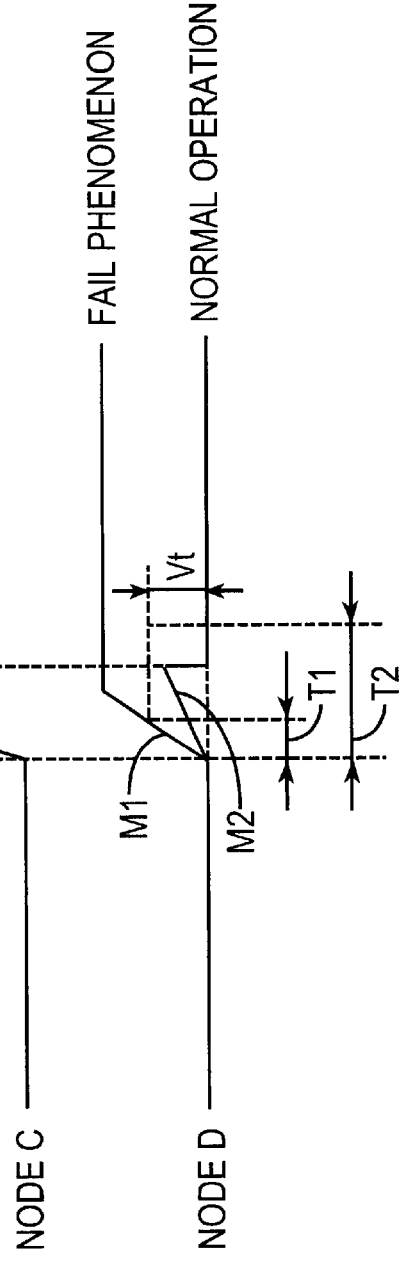
FIG. 20(a) CLOCK SIGNAL A
FIG. 20(b) CLOCK SIGNAL B
FIG. 20(c) NODE C
FIG. 20(d) NODE D

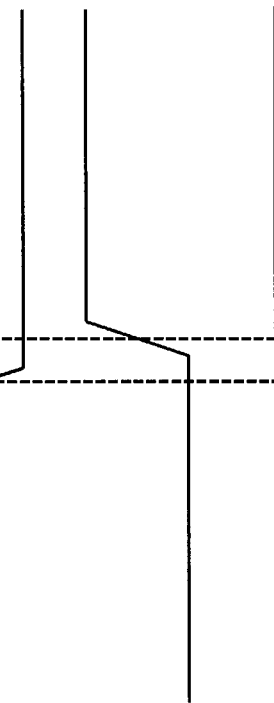
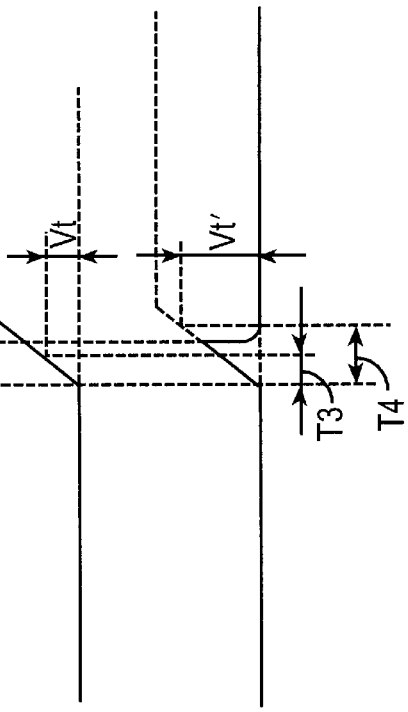
FIG. 22(a) CLOCK SIGNAL A
FIG. 22(b) CLOCK SIGNAL B
FIG. 22(c) NODE C
FIG. 22(d) NODE D (NO BIAS ELEMENT)
FIG. 22(e) NODE D (WITH BIAS ELEMENT)

FIG. 24(a) CLOCK SIGNAL A

FIG. 24(b) CLOCK SIGNAL B

FIG. 24(c) NODE C

FIG. 24(d) NODE D

MOTION CIRCUIT AND ON-BOARD DRIVER CIRCUIT FOR LIQUID CRYSTAL DISPLAY PANEL EMPLOYING THE MOTION CIRCUIT

BACKGROUND OF THE INVENTION (1) Field of the Invention

The present invention relates to a motion circuit which is composed of polycrystalline silicon semiconductor layers and has a logical circuit performing established operations with a normal phase and a reverse phase clock signal, and more specifically, to a motion circuit comprising a shift register such as a transfer gate type shift register, which shifts an entered start signal in time with a normal phase and a reverse phase clock signal.

The present invention also relates to an on-board driver circuit for a liquid crystal display panel employing the motion circuit.

(2) Description of the Prior Art

Driver circuits displaying images on a matrix display panel have been required to perform higher-speed operations as the display panel has a larger screen and higher resolution. To meet the demands, a driver circuit unit is generally made of a high-speed single crystalline silicon LSI and connected to a display panel from outside.

FIG. 25 is a circuit diagram showing the structure of a general driver circuit for a display panel. The diagram shows an external timing circuit 41, a scanning side driver circuit 42, an image signal side driver circuit 43, and a matrix display panel 44. The scanning side driver circuit 42 mainly consists of a shift register and a buffer. The image signal side driver circuit 43 comprises, when its image signal source is analog, a shift register, a buffer, and an analog switch, and comprises, if the image signal source is digital, a shift register, a latch, and a D/A converter as shown in FIG. 25. As for circuit operations, the external timing circuit 41 supplies the shift registers contained in the scanning side driver circuit 42 and the image signal side driver circuit 43 with start signals and clock signals. These two driver circuits select pixels on arbitrary positions on the display panel, thereby driving the pixel transistors ON so as to write image signals sequentially. The clock signals supplied from the external timing circuit 41 to the driver circuits 42 and 43 are single phase clock signals from which internal inverters 50 and 51 generate reverse phase clock signals.

On the other hand, it has been suggested that a display unit and a driver circuit should be formed on the same substrate of a display panel by employing polycrystalline silicon thin-film transistors. As shown in FIG. 26, the display panel 49 contains a scanning side driver circuit 46 and an image signal side driver circuit 47, and directly enters the output signals of the external timing circuit 45. The on-board driver circuit operates basically in the same manner as the driver circuit composed of single crystalline silicon; the driver circuit selects arbitrary pixels on the display unit 48, thereby driving the pixel registers ON as to write image signals sequentially. However, polycrystalline silicon is inferior to single crystalline silicon in the speed of transmitting clock signals to the driver circuits, so a normal phase and a reverse phase clock signal have to be entered instead of a single phase clock signal.

The reason for this is as follows. In the driver circuits 42 and 43 composed of single crystalline silicon, a delay time caused when single phase clock signals entered from the external timing circuit 41 are logical-reversed in the internal inverters 50 and 51 so as to generate reverse clock signals is so small that the phase difference (hereinafter referred to as skew) between the normal phase and the reverse phase clock signal causes no serious problems. In contrast, the use of polycrystalline silicon causes a longer delay time in the inverters, so that the generation of the normal phase and the reverse phase clock signal from the single clock signal might cause malfunctions of the driver circuit due to the skew between the normal phase and the reverse phase clock signal. In other words, a large skew between the normal phase and the reverse phase clock signal causes a so called fail phenomenon according to which the shift registers cannot latch signals at each stage sent from a previous stage, which prevents signals normally shifted in time from being outputted from the shift registers. As a result, the driver circuit causes malfunctions. To avoid the trouble, conventional driver circuits composed of polycrystalline silicon semiconductor layers are operated with a normal phase and a reverse phase clock signal having a small skew, which are directly supplied from an external timing circuit.

In the on-board driver circuit shown in FIG. 25, supplying a normal phase and a reverse phase clock signal from the external circuit 41 requires two clock signal lines for each of the scanning side driver circuit 42 and the image signal side driver circuit 43, so that a total of four clock signal lines are needed for external connection, which causes troublesome connecting operations.

In the on-board driver circuit composed of polycrystalline silicon semiconductor layers shown in FIG. 26, on the other hand, the characteristics of the thin-film transistors are far poorer than a driver circuit composed of single crystalline silicon, so that the power-supply voltage must be set at a higher level than in a MOSFET integrated circuit with single crystalline silicon. Consequently, the on-board driver circuit needs signal level conversion corresponding to the difference in power supply voltage when a signal is entered from an external circuit (MOSFET integrated circuit) composed of single crystalline silicon. For this, a level shifter circuit 100 is provided. However, the level shifter circuit 100 is made of thin-film transistors composed of polycrystalline silicon, so a normal phase and a reverse phase clock signal having no clock skew have a clock skew when passing the level shifter circuit 100. Thus, the fail phenomenon is caused when two-phase clock signals are entered, the same as when a single phase clock signal is entered, which makes it impossible to secure stable circuit operations of the shift registers.

In order to realize a smaller and thinner liquid crystal display panel, it has been considered to built a timing circuit on the same board as other units; however, it is impossible unless the fail phenomenon due to a clock skew is solved.

These problems are common to all motion circuits which are composed of polycrystalline silicon semiconductor layers and which have shift registers shifting start signals in time with a normal phase and a reverse phase clock signal.

SUMMARY OF THE INVENTION

In view of the above-mentioned problems, the object of the present invention is to provide a motion circuit which reduces the occurrence of the fail phenomenon due to the skew between a normal phase and a reverse phase clock signal for driving shift registers, thereby performing stable circuit operations with no malfunctions.

(1) In order to achieve the object, a first group of inventions comprises a clock skew reduction means for entering a normal phase clock signal and a reverse phase clock signal having a clock skew therebetween and for outputting a normal phase clock signal and a reverse phase clock signal having little clock skew therebetween to the shift register. The specific structure of the clock skew reduction means is realized by one of the following requirements (a)–(d) when a normal phase and reverse phase clock signals are generated from an entered single phase clock signal:(a) latch operations of the first and second latch circuits, (b) optimization of the transistor size of the first and second inverter chain circuits, (c) provision of a delay circuit on the reverse phase clock signal line side, or (d) provision of an inverter for each stage or for several stages of the shift register. As a result, a reduction in the skew between the normal phase and reverse phase clock signals secures stable operations of the shift register. Besides the shift register, the present invention is applicable to all kinds of logical circuits performing established operations by entering a normal phase and reverse phase clock signals.

A skew refers to the phase difference between a normal phase clock signal and a reverse phase clock signal.

The driver circuit having the structure (a) has the following effects. The first and second latch circuits entering a normal phase and reverse phase clock signals having a clock skew perform latch operations to be timed to make the normal phase and reverse phase clock signals have reverse polarities, and supply the latched signals to the respective shift registers as clock signals. As a result, the shift registers are each supplied with a normal phase and reverse phase clock signals having no skew.

The driver circuit having the structure (b) has the following effects. As for the first and second inverter chain circuits, there is a combination between an odd number of stages and an even number of stages that makes a minimum delay time of the inverter chain when the rate of increase in the transistor size between adjacent inverters is uniform. Therefore, the first and second inverter chain circuits are set to the combination of the odd number of stages and the even number of stages. As a result, when a single phase clock signal is entered to each of the first and second inverter chain circuits, the first and second inverter chain circuits output a normal phase and reverse phase clock signals having little skew.

The driver circuit having the structure (c) has the following effects. An entered single phase clock signal is reversed by the inverters to generate a reverse phase clock signal. The entered single phase clock signal is also sent to a delay circuit to be outputted as a normal phase lock signal. The delay circuit will delay the single phase clock signal by an established delay time so that there is no phase difference between the normal phase clock signal and the reverse phase clock signal. Consequently, the normal phase clock signal outputted from the delay circuit and the reverse phase clock signal outputted from the inverter should have little skew therebetween, which makes the shift register be supplied with these two clock signals having little skew.

The driver circuit having the structure (d) has the following effects. One inverter is provided for each stage or for a plurality of stages of the shift register in order to change either one of a normal phase and reverse phase clock signals into an opposite-phase clock signal. At that moment, the normal phase and reverse phase clock signals have the same length of skew as the delay time of the inverters; however, the load applied on the clock signal line is as small as one stage or several stages, so that the delay time of the inverters, or the clock skew is minimized.

(2) The second group of inventions provides the shift register with a means for increasing the maximum clock skew permitted by the shift register. The specific approaches to increasing the maximum permissible clock skew are as follows: (a) to increase time constant defined by the ON resistance of the first switching means and the input capacity of the second inverter, (b) to increase an rms value of the threshold voltage of the second inverter, and (c) to provide one delay circuit between each adjacent stages of the shift register. The maximum clock skew on each stage of the shift register (excluding the first stage having no fail phenomenon due to a clock skew) is increased to prevent the fail phenomenon, which secures stable operations of the shift register. Besides the shift register, the present invention is applicable to all logical circuits performing established operations with a normal phase and reverse phase clock signals.

The driver circuit having the structure (a) has the following effects. Increasing the time constant defined by the ON resistance of the first switching means and the input capacity of the second inverter decreases the increase rate of the input potential of the second inverter, which means an increase in the maximum clock skew on each stage of the shift register. Consequently, the input voltage of the second inverter fails to reach the threshold of the second inverter in the skew period, thereby preventing the occurrence of the fail phenomenon. The maximum permissible skew refers to the time required for the input potential of the second inverter to reach the threshold voltage of the second inverter.

The driver circuit having the structure (b) has the following effects. Even if the input potential of the second inverter increases, it fails to reach the threshold of the second inverter in a skew period because the threshold has a large effective value. This leads to the successful prevention of the occurrence of the fail phenomenon.

The driver circuit having the structure (c) has the following effects. Even if the input potential of the second inverter increases, it fails to reach the threshold of the second inverter in a skew period because the delay circuit provided between each adjacent stages of the shift register delays the input voltage starting to change. As a result, the occurrence of the fail phenomenon is successfully prevented.

(3) The application of the above-mentioned approaches (1) and (2) to an image signal side driver circuit and a scanning side driver circuit realizes a highly reliable on-board driver circuit for a liquid crystal display panel having no malfunctions due to the skew between a normal phase and reverse phase clock signals. Needless to say, the present invention is applicable to all motion circuits composed of polycrystalline silicon semiconductor layers as well as on-board driver circuits for a liquid crystal display panel.

(4) The effects of the first group of inventions and the second group of inventions are summarized as follows.

In a motion circuit composed of polycrystalline silicon semiconductor layers, and an on-board driver circuit for a liquid crystal display panel employing the motion circuit, the occurrence of the fail phenomenon due to the skew between a normal phase and reverse phase clock signals is prevented, which secures stable circuit operations with no malfunction. This allows the circuit to enter only a single phase clock signal from an external timing circuit, which reduces the number of connections with the external timing circuit. Furthermore, the absence of the fail phenomenon due to a clock skew allows the timing circuit to be an internal circuit, making a device or a liquid crystal panel provided with the motion circuit smaller and thinner in size.

The first and second group of inventions have their own effects as follows.

① Effects of the First Group of Inventions (a) In an on-board driver circuit for a liquid crystal display panel composed of polycrystalline silicon semiconductor layers, a normal phase and reverse phase clock signals generated inside the driver circuit by entering a single phase clock signal has a reduced skew therebetween, so that the shift register can operate in a stable manner with a small maximum permissible clock skew.

(b) The generation of the normal phase and reverse phase clock signals from an entered-single phase clock signal not only reduces the number of connection lines between the external timing circuit and the display panel, but also ensures compatibility with an external timing circuit for a conventional single crystalline silicon LSI.

(c) The structure of latching a clock signal by a specific signal can be applied to the low-speed clock signal of the scanning side shift register. The input/output signal of the image signal side shift register can be used as the specific signal instead of newly providing a latch pulse signal, so that the structure can be realized only by adding a simple circuit.

(d) The use of inverter chains has a simple circuit structure and allows the generation of the normal phase and reverse phase clock signals from an entered single phase clock signal. It also can be applied to the high-speed clock signal on the image signal side for its wide applicability.

(e) The generation of a reverse phase clock signal by the inverter provided for each stage or several stages not only allows the generation of the normal phase and reverse phase clock signals from an entered single phase clock signal, but also be realized only by adding a simple circuit. It also can be applied to the high-speed clock signal on the image signal side for its wide applicability.

② Effects of the Second Group of Inventions (a) Increasing time constant indicates increasing the clock skew of an entered clock permitted by a driver circuit itself (the maximum permissible clock skew). Consequently, stable operations of the driver circuit are secured even if a clock skew is somehow large, which improves the performance of the liquid crystal display panel containing the driver circuit.

Furthermore, the increase in time constant can be easily achieved by controlling the transistor size, which facilitates the control of the maximum permissible clock skew.

(b) Increasing the effective value of the threshold voltage of the second inverter has an effect of meeting the recent demand for making the threshold voltage of the transistor smaller, in addition to the above-mentioned effects of the second group of inventions.

(c) Disposing a delay circuit between each adjacent stages of the shift register has high control over the maximum permissible clock skew and high flexibility in design because an increase in the maximum permissible clock skew can be controlled by the number of delay circuits, in addition to the above-mentioned effects of the second group of inventions.

BRIEF DESCRIPTION OF THE DRAWINGS

FIG. 2 is a diagram showing the structure of a transfer gate.

FIGS. 3(a)–3(e) are timing charts when there is no skew between clock signals A and B in the shift register of FIG. 1.

FIGS. 4(a)–4(i) are timing charts when there is a skew between clock signals A and B in the shift register of FIG. 1.

FIGS. 10(a)–10(f) are timing charts explaining skew reduction operations of the scanning side driver circuit of Embodiment 2.

FIG. 11 is a diagram explaining the timing of latching latch pulse signals.

FIGS. 20(a)–20(d) are waveforms explaining operations of the driver circuit of Embodiment 6 in a skew period.

FIGS. 22(a)–22(e) are waveforms explaining operations of the driver circuit of Embodiment 7 in a skew period.

DESCRIPTION OF THE PREFERRED EMBODIMENTS

In order to make the present invention more easily understandable, the fail phenomenon problem due to a clock skew in a shift register, which has been solved in the present invention, will be detailed as follows before the description of the preferred embodiments.

Figure 1:
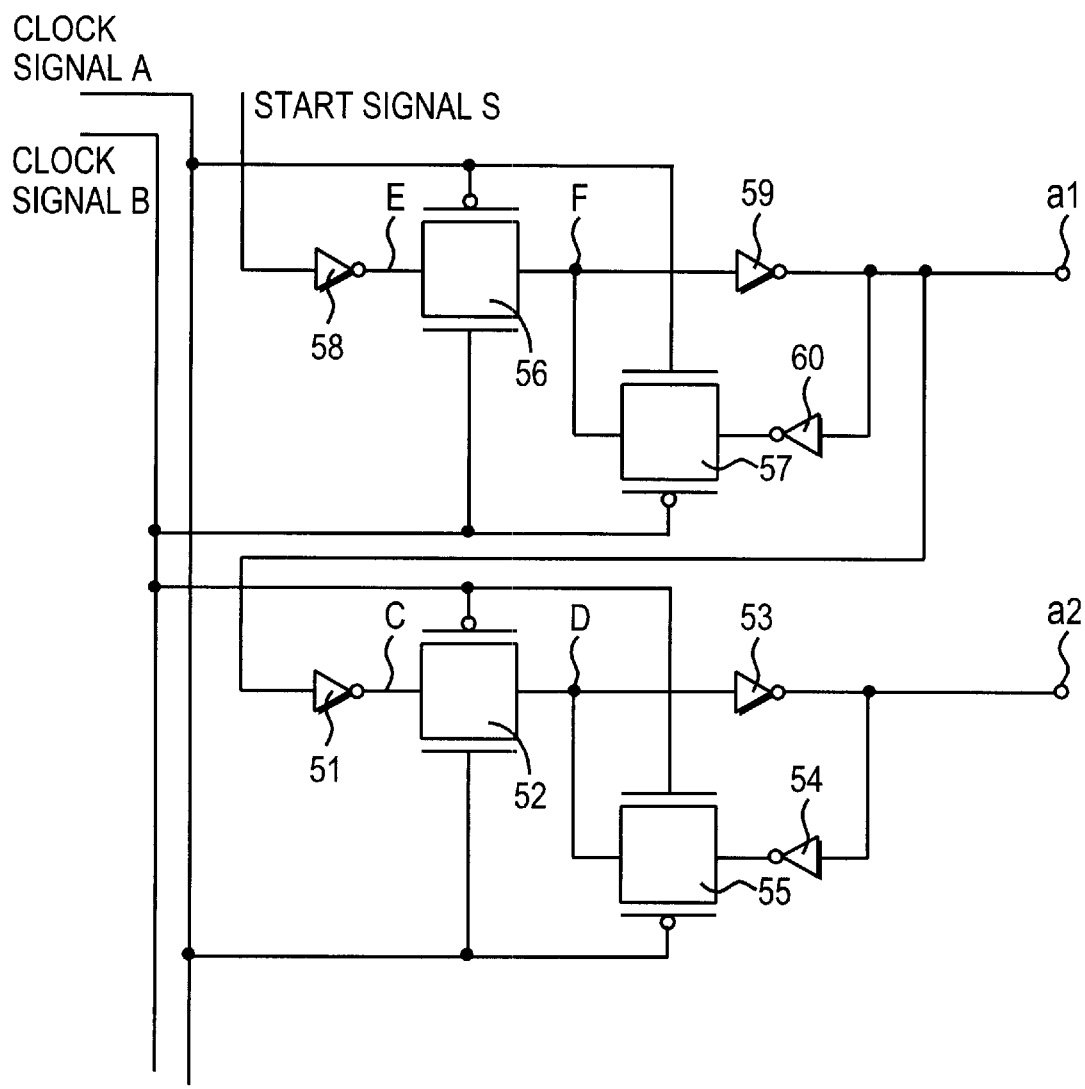
FIG. 1 is a diagram showing the structure of a typical transfer gate type shift register.

FIG. 1 is a diagram showing the structure of a typical transfer gate type shift register where only the first and second stages are shown for convenience of explanation. The first stage of the shift register comprises inverters 58, 59 and 60 and transfer gates 56 and 57. The second stage contains inverters 51, 53 and 54 and transfer gates 52 and 55. The first stage enters a start signal, and the subsequent stages enter the outputs of the previous stages. At each stage, a normal phase and reverse phase clock signals A and B control ON/OFF operations of the respective transfer gate. At odd-numbered stages, the P-channel transistor and the N-channel transistor of the transfer gate 56 are connected to the clock signals A and B, respectively, whereas the P-channel transistor and the N-channel transistor of the transfer gate 57 are connected to the clock signals B and A, respectively. At even-numbered stages, the P-channel transistor and the N-channel transistor of the transfer gate 52 are connected to the clock signals B and A, respectively, whereas the P-channel transistor and the N-channel transistor of the transfer gate 55 are connected to the clock signals A and B, respectively. Consequently, at each odd-numbered stage, when one of the transfer gates 56 and 57 is ON, the other is OFF, and the ON/OFF states of the transfer gates 56 and 57 are alternated by the clock signals A and B. The shift register thus structured operates differently as follows, depending on whether or not there is a skew between the clock signals A and B.

For reference, logical conditions between input and output of a transfer gate will be described with reference to FIG. 2. In FIG. 2 Vi and Vo represent input signal and output signal, respectively, and CK1 and CK2 indicate control signals (clock signals) having opposite polarities to each other. For example, when the clock signal CK1 is LOW and the clock signal CK2 is HIGH, the transfer gate is ON as shown in Table 1. As a result, the input signal vi passes the transfer gate to become the output signal Vo. As shown in Table 1, the output signal Vo is LOW and HIGH when the input signal Vi is LOW and HIGH, respectively.

TABLE 1

| input signal Vi | clock signal CK1 | clock signal CK2 | state | output signal Vo |
|---|---|---|---|---|
| L | L | H | ON | L |
| L | H | L | OFF | Vo' |
| H | L | H | ON | H |
| H | H | L | OFF | Vo' |

When the clock signal CK1 is HIGH and the clock signal CK2 is LOW, on the other hand, the transfer gate is OFF as shown in Table 1. As a result, the output signal Vo remains as it was before the transfer gate is OFF.

Based on these transfer gate logical conditions, operations of the shift register when there is and there is not a skew between the clock signals A and B will be described as follows.

(1) When there is a skew between the clock signals A and

Assume that a start signal S enters with no skew between the clock signals A and B as shown in FIGS. 3(*a*) and 3(*b*), and that the start signal S makes a LOW to HIGH transition when the clock signal A is HIGH, and also makes a HIGH to LOW transition when the clock signal B is LOW as shown in FIG. 3(*c*). When the start signal S enters into the inverter 58, if the transfer gate 56 is ON, the signal is outputted as it is to the output terminal a1 because the transfer gate 57 is OFF when the transfer gate 56 is ON. When the transfer gate 56 is OFF, the transfer gate 57 is ON, so that a start signal S is latched by a closed circuit consisting of the transfer gate 57 and the inverters 59 and 60. The latched signal is taken into the second stage the moment the transfer gate 52 of the second stage becomes ON. Since there is no skew between the clock signals A and B, the same operations as in the first stage are performed in the second stage. As a result, as shown in FIGS. 3(*d*) and 3(*e*), each of the output terminals a1 and a2 outputs a signal shifted in time by a half period of the clock signals. The same operations as in the second stage are performed on and after the third stage. Consequently, signals shifted in time by a half period of the clock signals are sequentially outputted from all the stages. Thus, the shift register properly operates when there is no skew between the clock signals A and B.

(2) When there is a Skew between the Clock Signals A and B

Assume that there is a skew between the clock signals A and B as shown in FIGS. 4(*a*) and 4(*b*), and that the start signal S makes a transition when the clock signal A is HIGH and the clock signal B is LOW in the same manner as the above case (1) (refer to FIG. 4(*c*)).

(1) Operations at the First Stage

In a skew period Ts (the period between time t1 and time t2) where both the clock signals A and B are LOW, the P-channel transistors of the transfer gates 56 and 57 are ON and the N-channel transistors are OFF. Also, the node E entered into the transfer gate 56 remains LOW. Consequently, the output node F remains HIGH. At time t2 when the skew period TS has passed, the transfer gate 56 is completely ON and the transfer gate 57 is completely OFF, so that the node F becomes LOW, allowing data to be held.

In a skew time Ts (the period between time t3 and time t4) where both the clock signals A and B are HIGH, the P-channel transistors of the transfer gates 56 and 57 are OFF and the N-channel transistors are ON. Also, the node E entered into the transfer gate 56 remains LOW. Consequently, the output node F remains LOW. At time t4 when the skew period Ts has passed, the transfer gate 56 is completely OFF and the transfer gate 57 is completely ON, so that the node F remains LOW, allowing data to be taken.

In a skew time Ts (the period between time t5 and time t6) where both the clock signals A and B are LOW, the P-channel transistors of the transfer gates 56 and 57 are ON and the N-channel transistors are OFF. Also, the node E entered into the transfer gate 56 remains HIGH. Consequently, the output node F becomes HIGH at time t5. Since the signal to be outputted as the output of the first stage has the phase of a start signal delayed by a fixed time interval, regular circuit operations are performed even with the presence of skew.

(2) Operations at the Second Stage

In the skew period Ts between time t1 and t2 and in the skew period Ts between time t3 and time t4, regular circuit operations are performed. In the skew period Ts between time t5 and t6, on the other hand, there are malfunctions due to a skew. Operations during the skew period Ts between T5 and t6 will be detailed as follows. In the skew period Ts, both the clock signals A and B are LOW, and the P-channel transistors of the transfer gates 52 and 55 are ON, and the N-channel transistors are OFF. At time t5, the node C entered onto the transfer gate 52 makes a LOW to HIGH transition, so that the transfer gate 52 tries to make the output node D reverse from LOW to HIGH. The transfer gate 55, on the other hand, tries to hold the node D LOW, but cannot because the N-channel transistor of the transfer gate 55 has not been ON yet. As a result, as shown in FIGS. 5(*a*) and 5(*b*), the potential of the node D continues to rise in the skew period Ts. The increase rate of the potential is determined by the on current of the transfer gate 52 and the gate capacity of the inverter 53.

Figure 5A:
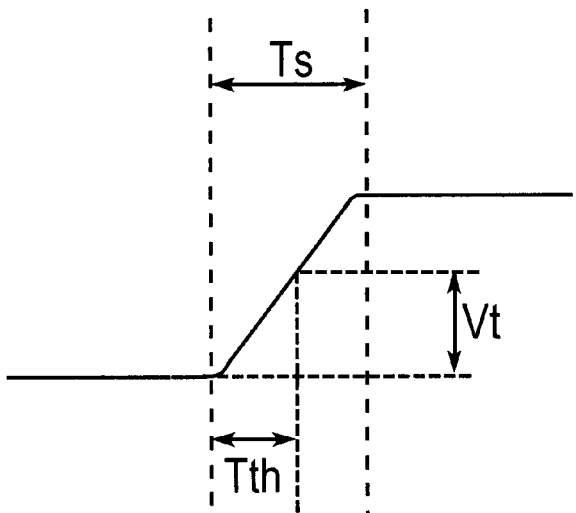
FIGS. 5(a)–5(b) are waveforms explaining the occurrence of the fail phenomenon due to a skew.

When a skew period Ts is longer than the time Tth required for the potential of the node D to reach the threshold voltage Vt of the inverter 53 (Ts>Tth) as shown in FIG. 5(a), the node D becomes HIGH in the skew period Ts, causing the fail phenomenon (refer to FIG. 4(i)). In regular operations, the node D is supposed to be LOW until time t7 and to become HIGH at time t7 as indicated with chain line nl in FIG. 4(i). Consequently, when Ts>Tth, the node D becomes HIGH before time t7, which causes malfunctions of the shift register.

Figure 5B:
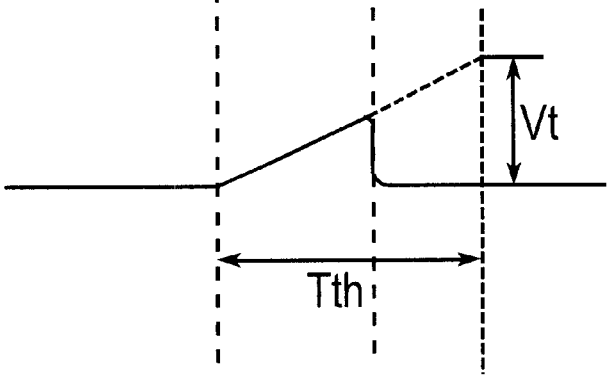

When the skew time Ts is shorter than Tth (Ts<Tth) as shown in FIG. 5(b), the node D is held without reversing, which provides regular operations. Since single crystalline silicon transistors have very short skew periods, it corresponds to the case shown in FIG. 5(b) where there is no problem in circuit operations. Each Tth in FIGS. 5(a) and 5(b) indicates the maximum clock skew permitted in the shift register. The fail phenomenon appears on and after the second stage because it occurs when a signal entered in each stage of the shift register makes a transition in a skew period.

When a normal phase and reverse phase clock signals are generated from an entered single phase clock signal with a driver circuit composed of a polycrystalline silicon semiconductor, the inverters have a delay time to generate the reverse phase clock signal, causing a clock skew of several tens of nanoseconds. This does not secure stable operations of the shift register.

The inventors of the present invention have found that when the image signal side shift register and the scanning side shift register have the same design concerning the maximum clock skew permitted by the shift registers, the low-speed scanning side shift register is required the same clock skew requirements as the high-speed image signal side shift register. According to the measurement of the inventors, the maximum permissible clock skew became about 60 ns when a transfer gate type shift register composed of transistors having a mobility of about 70 cm$^2$/V·sec and a threshold voltage of about 2.5 V had an operation frequency of 1 MHz and a driver voltage of 15 V, and the maximum permissible clock skew also became about 60 ns when the operation frequency was 10 kHz. The results of the measurement indicate that the scanning side shift register usually operating at 15.75 kHz causes the fail phenomenon even with a skew of 1/635 ones can period. It has not been recognized until now that the scanning side shift register has very severe requirements to avoid a clock skew. It has been realized that the fail phenomenon must be prevented not only on the image signal side but also on the scanning side.

By considering the arising mechanism of the fail phenomenon, it is understood that malfunctions of the shift register can be solved by (1) reducing a skew as much as possible or by (2) increasing the maximum clock skew permitted by the shift register (maximum permissible clock skew).

In view of this, the inventors of the present invention have contrived a first group of inventions related to the approach (1) and a second group of inventions related to the approach (2).

The first group of inventions and the second group of inventions will be described in detail as follows.

FIRST GROUP OF INVENTIONS

The first group of inventions, which prevent the occurrence of the fail phenomenon by reducing the skew of the clock signals entered into a shift register, will be described in Embodiments 1–5 as follows.

EMBODIMENT 1

Figure 6:
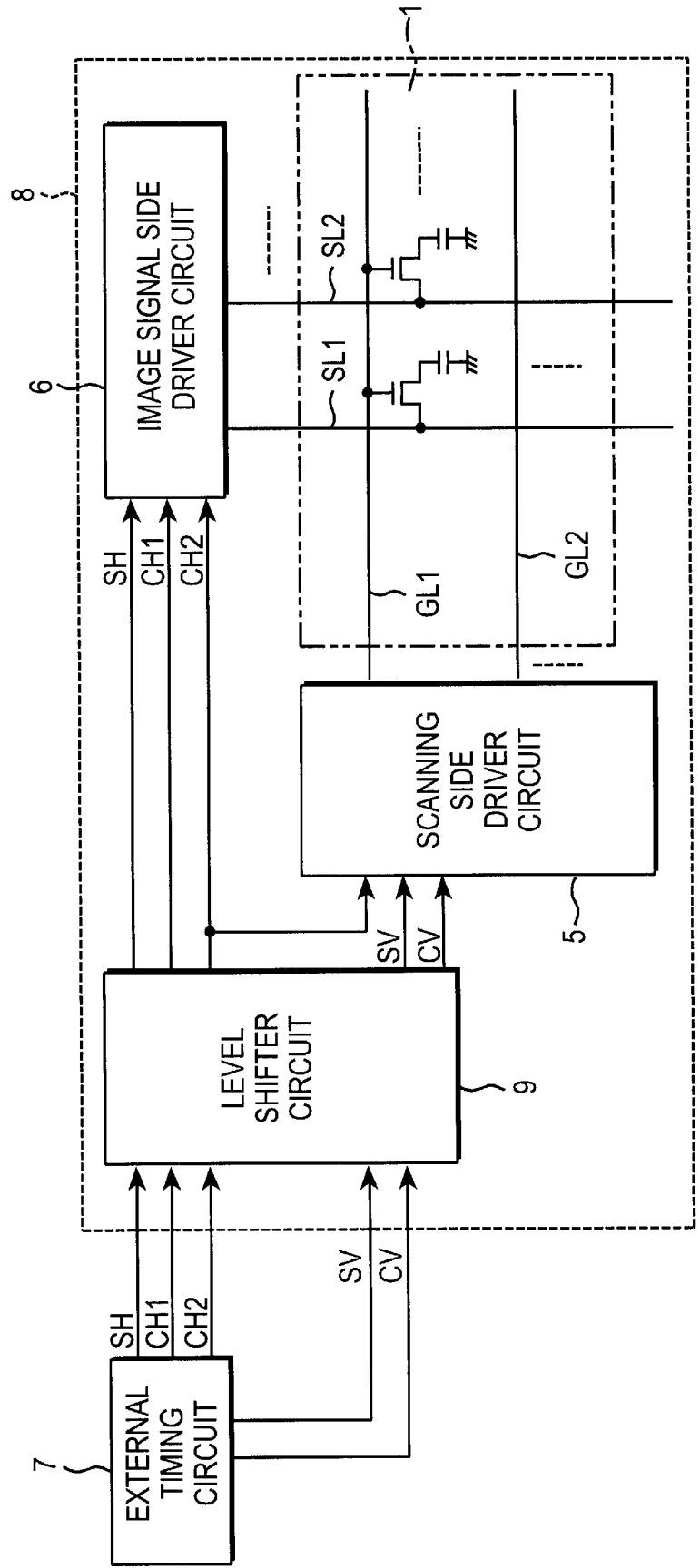
FIG. 6 is a diagram showing the entire structure of the on-board driver circuit of Embodiment 1.
Figure 7:
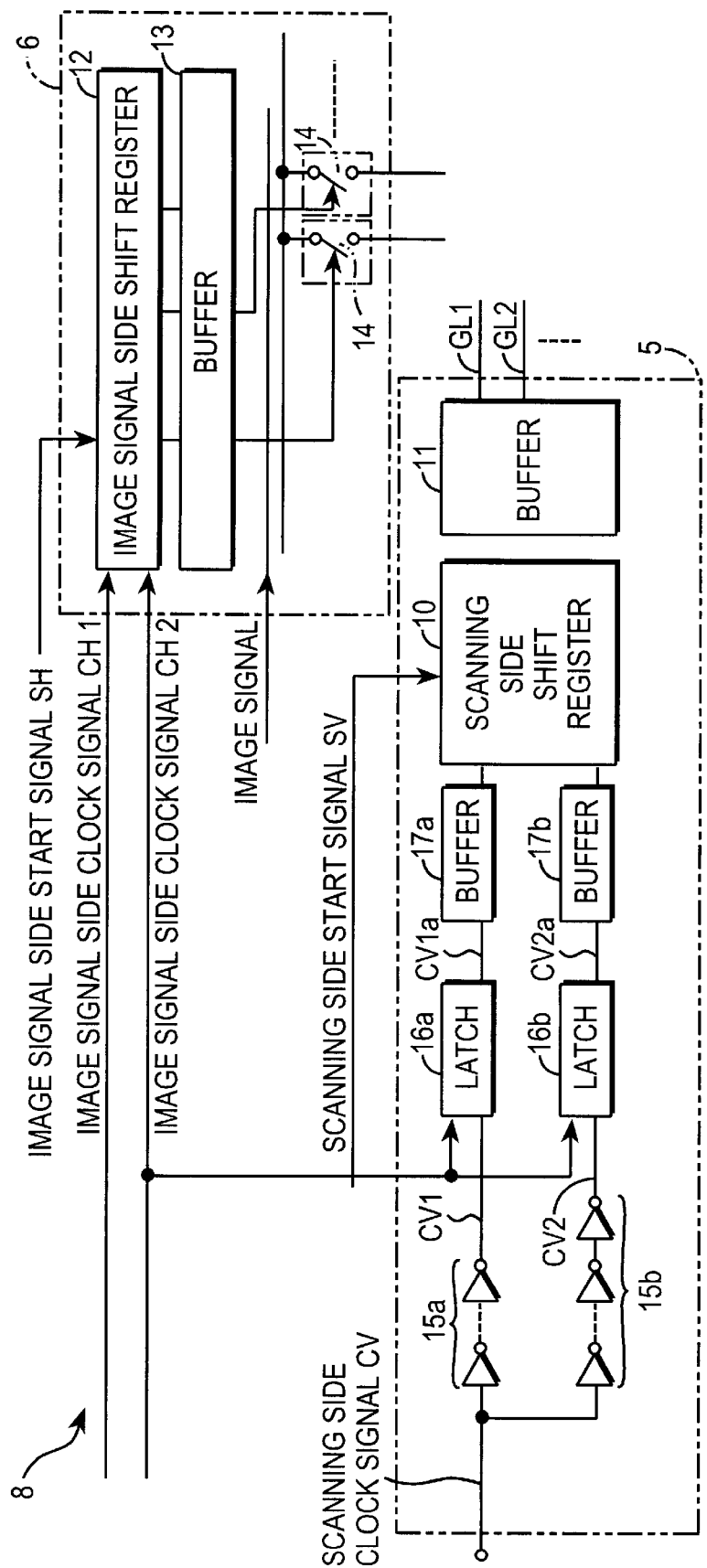
FIG. 7 is a diagram showing the concrete structure of the scanning side driver circuit of Embodiment 1.

FIG. 6 is a diagram showing the entire structure of the on-board driver circuit for a liquid crystal display panel according to the present invention, FIG. 7 is a diagram showing the concrete structure of a scanning side driver circuit, and FIGS. 8(a)–8(e) are timing charts explaining skew reduction operations of the scanning side driver circuit. The liquid crystal display panel 8 of the present invention is an active matrix type liquid crystal display panel 8. The on-board driver circuit driving a liquid crystal display unit 1 comprises a level shifter circuit 9 multiplying the voltage of various control signals including a clock signal sent from an external timing circuit 7, a scanning side driver circuit 5 outputting scan pluses sequentially to scan lines GL1, GL2 and so on, and an image signal side driver circuit 6 outputting image signals to source lines SL1, SL2 and so on. The level shifter circuit 9, the scanning side driver circuit 5, and the image signal side driver circuit 6 are each composed of polycrystalline silicon semiconductor layers formed on the array substrate of the liquid crystal display panel 8. The external timing circuit 7 has a power-supply voltage of 2 to 5 V and the on-board driver circuit has a power-supply voltage of 12 to 15 V, so it is necessary to shift the level of the control signals including the clock signal sent from the external timing circuit 7. This is the reason the level shifter circuit 9 is provided.

As shown in FIG. 7, the scanning side driver circuit 5 comprises a scanning side shift register 10 and a buffer 11. The image signal side driver circuit 6 comprises an image signal side shift register 12, a buffer 13 and analog switches 14. The scanning side and image signal side shift registers 10 and 12 have the same structure and the same basic operations as the transfer gate type shift register shown in FIG. 1.

As shown in FIG. 6, the external timing circuit 7 supplies the scanning side driver circuit 5 with a scanning side start signal SV and a scanning side clock signal CV as timing signals, and also supplies the image signal side driver circuit 6 with an image signal side start signal SH and image signal side clock signals CH1 and CH2 having opposite polarities to each other. The scanning side driver circuit 5 will enter a single phase clock signal only, which is the scanning side clock signal CV, and the image signal side driver circuit 6 will enter the normal phase clock signal CH1 and the reverse phase clock signal CH2. These clock signals CH1 and CH2 have no clock skew because they are generated in the external timing circuit 7; however, a clock skew arises when the clock signals CH1 and CH2 pass the level shifter circuit 9. In order to reduce the clock skew, the image signal side driver circuit 6 is supplied with latch circuits, like the scanning side driver circuit 5, and receives latch signals from outside.

The specific structure of the scanning side driver circuit 5 is shown in FIG. 7. The scanning side driver circuit 5 comprises inverter chain circuits 15a and 15b having different number of stages from each other by an odd number, a first latch circuit 16a, a second latch circuit 16b, and buffers 17a and 17b. The first and second latch circuits 16a and 16b will enter the image signal side clock signal CH2 as a latch pulse signal. It is needless to say that the image signal side clock signal CH1 may be used as the latch pulse signal.

Figure 8:
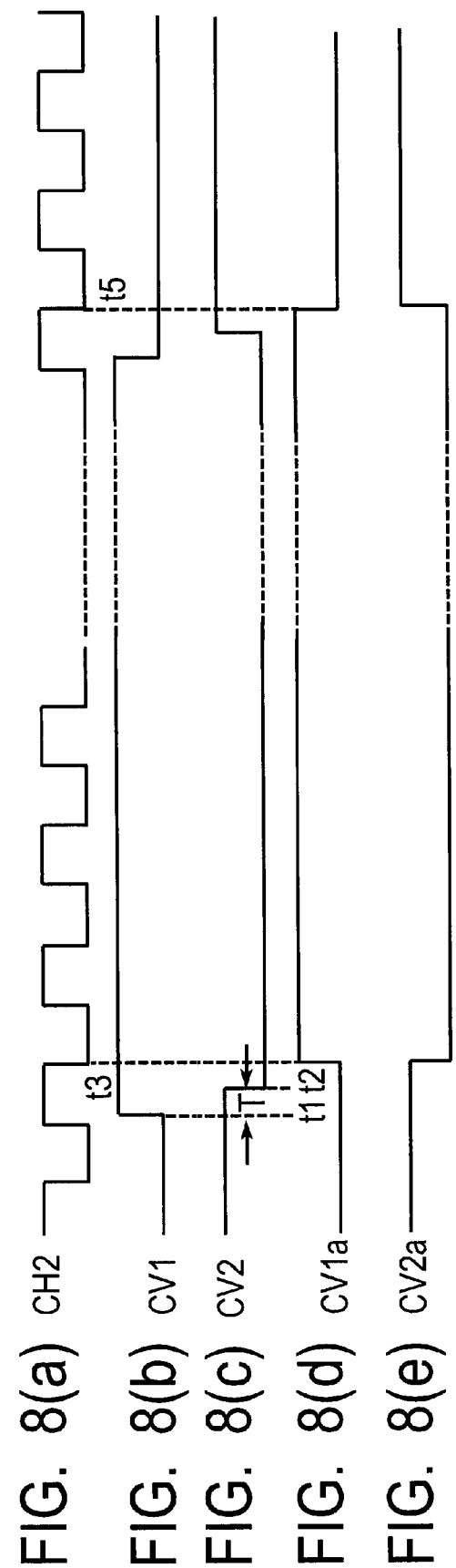
FIGS. 8(a)–8(e) are timing charts explaining skew reduction operations of the scanning side driver circuit of Embodiment 1.

The following is a description of the operations of the scanning side driver circuit 5 having the above-described structure, particularly of the operations about a reduction in a clock skew. The single phase clock signal CV supplied from the external timing circuit 7 enters the inverter chain circuits 15a and 15b, and in turn a clock signal CV1 shown in FIG. 8(b) is outputted from the inverter chain circuit 15a, and a clock signal CV2 shown in FIG. 8(c), which is the reverse of the clock signal CV1, is outputted from the inverter chain circuit 15b. Then, a normal phase and reverse phase clock signals CV1a and CV2a are generated by the latches 16a and 16b. The clock signal CV1 and the clock signal CV2 have a clock skew T (refer to FIG. 8(c)) corresponding to the difference in delay time between the inverter chain circuits 15a and 15b. In the present embodiment, the clock skew T has a shorter period than the image signal side clock signal CH2.

The latch circuits 16a and 16b will latch an entered signal at a falling edge of the image signal side clock signal CH2 as a latch pulse signal, and hold the latched signal until the data is updated at the next falling edge. The latch circuits 16a and 16b may be designed to latch a signal at the rising edge of the clock signal CH2.

The operations of the latch circuits 16a and 16b will be described as follows with reference to the timing charts of FIGS. 8(a)–8(e). When the clock signal CV1 becomes HIGH at time t1, the clock signal CH2 remains HIGH, so that the latch 7f circuit 16a outputs the signal CV1a which remains LOW as shown in FIG. 8(d). Similarly, when the clock signal CV2 becomes LOW at time t2, the latch circuit 16b outputs the signal CV2a which remains HIGH as shown in FIG. 8(e). When the clock signal CH2 becomes LOW at time t3, the first latch circuit 16a latches the clock signal CV1. Consequently, at time t3, the clock signal CV1a makes a LOW to HIGH transition as shown in FIG. 8(d), and at the same time, the latch circuit 16b latches the clock signal CV2. Since the clock signal CV2 is LOW at time t3, the clock signal CV2a makes a HIGH to LOW transition. After time t3, the latch circuits 16a and 16b latch the clock signals CV1 and CV2, respectively, at a falling edge of the clock signal CH2 in the same manner. It should be noted that after time t3, the clock signal CV1 remains HIGH and the clock signal CV2 remains LOW, so that the output clock signals CV1a and CV2a remain HIGH and LOW, respectively. When the clock signal CH2 falls at time t5, the clock signal CV1 (L level) is latched by the first latch circuit 16a, which causes the output clock signal CV1a to make a HIGH to LOW transition. At the same time, the clock signal CV2 (H level) is latched by the second latch circuit 16b, which causes the output clock signal CV2a to make a LOW to HIGH transition. Thus, the normal phase and reverse phase clock signals CV1a and CV2a having no skew T are supplied to the scanning side shift register 10 via the buffers 17a and 17b. As a result, the occurrence of the fail phenomenon due to the clock skew is prevented.

The image signal side driver circuit 6 is designed to enter the normal phase and reverse phase clock signals CH1 and CH2 having no skew from the external timing circuit 7 in the present embodiment. Instead, one of the driver circuits shown in Embodiments 3 through 8 below may be used as the image signal side drive circuit 6 so as to enter only a single phase clock signal, like the scanning side driver circuit. This structure makes it possible to prevent the fail phenomenon due to a clock skew and eventually to realize circuit operations with no malfunctions.

EMBODIMENT 2

Figure 9:
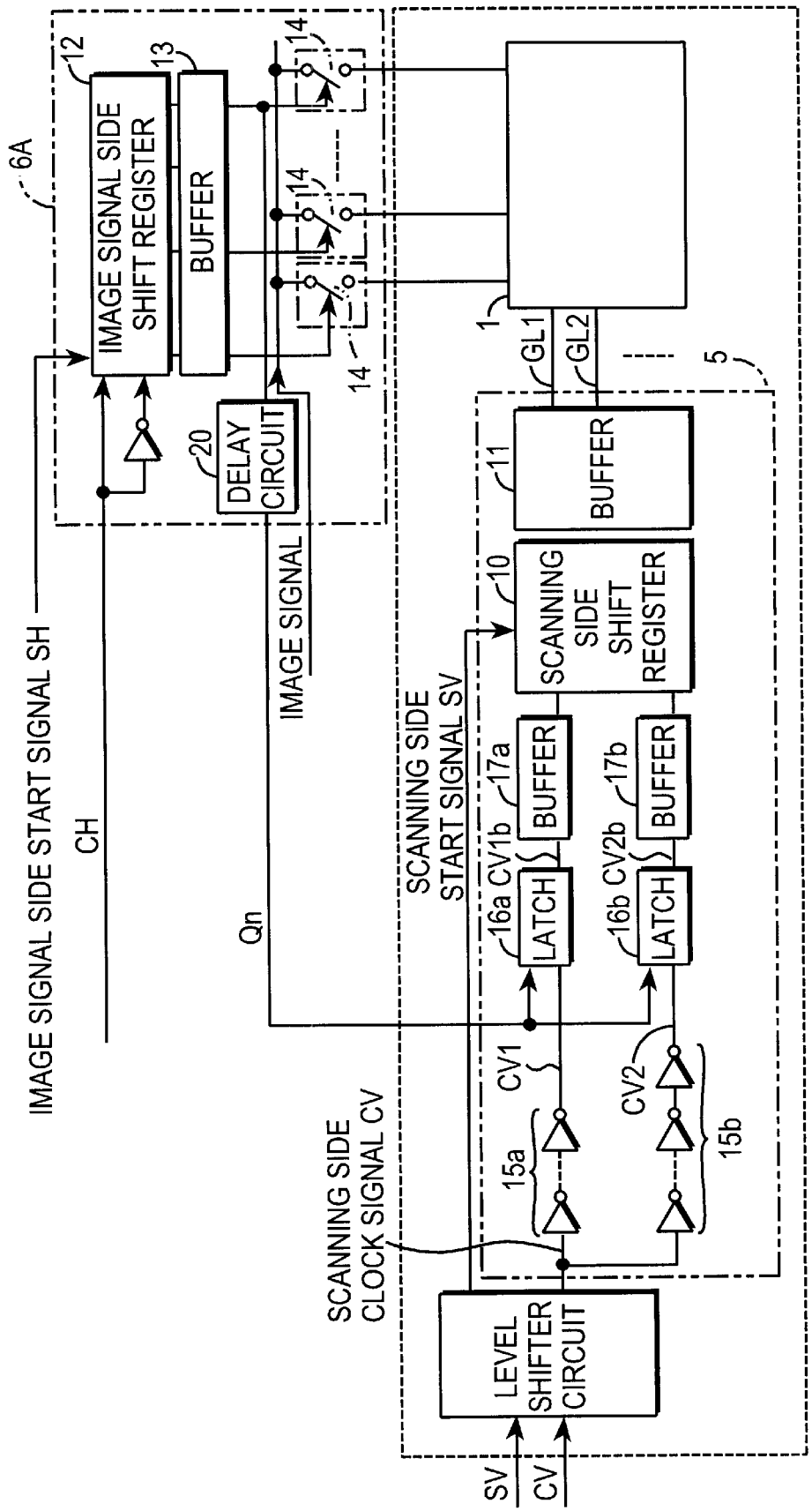
FIG. 9 is a diagram showing the entire structure of the on-board driver circuit of Embodiment 2.

FIG. 9 is a diagram showing the entire structure of the driver circuit of Embodiment 2, and FIGS. 10(a)–10(f) are the timing charts of the driver circuit. In the present embodiment, the scanning side driver circuit 5 is a circuit internal to a liquid crystal display panel, but an image signal side driver circuit 6A, which is composed of single crystalline silicon, is an external circuit. The image signal side driver circuit 6A is external because it must be composed of single crystalline silicon transistors to meet the demands for high transistor performance when a liquid crystal display panel has a large screen. Consequently, in the present embodiment, the image signal side clock signal has a much shorter period than that in Embodiment 1, so that the skew period of a normal phase and reverse phase scanning side clock signals CV1 and CV2 becomes longer than that of the image signal side clock signal CH. This makes it impossible to use the image signal side clock signal CH as a latch pulse signal, unlike in Embodiment 1. In the present embodiment, therefore, a start signal SH having a long period is used as the latch pulse signal.

To be more specific, in order to latch the clock signals CV1 and CV2 at a proper timing to make these signals logical reverse, an output signal Qn, which is obtained by shifting the start signal SH of the image signal side shift register 12 in time to an appropriate position, is used as the latch pulse signal. As shown in FIGS. 10(b)–10(d), the clock signals CV1 and CV2 can be latched at an appropriate timing even if there is somewhat large skew because the period of the output signal Qn corresponds to one scan period. The output signal Qn is timed to be latched within a blanking period by delaying the output signal Sn on the final stage of the image signal side shift register by a delay circuit 20.

Operations to reduce a skew will be described as follows with reference to FIGS. 10(a)–10(f). The basic operations are the same as those of Embodiment 1; in the present embodiment, however, the first latch circuit 16a and the second latch circuit 16b perform latch operations at the rising edge of the signal Qn. Consequently, at time t3, the latch circuits 16a and 16b latch the clock signals CV1 and CV2, respectively, which makes the clock signal CV1b HIGH and the clock signal CV2b LOW. At time t5, the latch circuits 16a an 16b again latch the clock signals CV1 and CV2, respectively, which makes the clock signal CV1b LOW and the clock signal CV2b HIGH. Finally, the normal phase and reverse phase clock signals CV1b and CV2b having no clock skew are successfully supplied to the shift register 10.

Although the signal Sn outputted from the final stage of the shift register is used as the latch pulse signal in the present embodiment, a signal outputted from a middle stage may be used or the start signal may be used directly. In those cases, it is necessary to provide a delay circuit so as to latch each signal within the blanking period, like the case where the output signal on the final stage is latched.

The reason that a signal outputted from an in-between stage or the final stage of the shift register is delayed via the delay circuit instead of using it directly as the latch signal will be described as follows with reference to FIGS. 11(a)–11(e). FIG. 11(a) shows the image signal side clock signal CH, FIG. 11(b) the output signals S1–Sn (which turn on/off the analog switches 14) from the first to final stages, respectively, of the shift register, FIG. 11(c) a scan pulse G1 to be sent to the first scan line GL1, FIG. 11(d) a scan pulse G2 to be sent to the second scan line GL2, and FIG. 11(e) a scan pulse G3 to be sent to the third scan line GL3. In a liquid crystal driver circuit, the writing of image signals requires turning on all the image transistors connected to the respective scan lines before turning on the analog switches 14 sequentially. It takes some time to turn on all the image registers connected to the scan lines, so that the scan pulses are usually timed several $\mu$seconds earlier than the time to turn on the analog switches 14 connected to the first source line. The margin of several $\mu$seconds allows the rising edge of the scan pulses to be in the blanking period W (having no image signal), so that the latch signals to latch the scan signals must be in the blanking period W. This is the reason the output signals S1–Sn from the first to final stages are not used directly as the latch pulse signals, but delayed for an appropriate span of time by the delay circuit 20 in order to bring the latch pulse signals to the latch positions shown in FIGS. 11(a)–11(e). To meet the demands, the delay circuit 20 has a preprogrammed delay time. The provision of the delay circuit 20 makes it possible to latch the clock signals within the blanking period W and to put the rising edge of the scan pulse in the blanking period W.

In this manner, the setting of the rising edge of each scan pulse within the blanking period W is realized when the generation time of the latch signals is adjusted with a delay circuit as follows. By using either the output signal Qn of the image signal side shift register 12 or the image signal side start signal SH, the normal phase and reverse phase scanning side clock signals CV1 and CV2 are latched earlier than the time for the image signal to be written on the first pixel of the scan line selected by the scanning side shift register 5 by the time to turn on all the transistors connected to the scan lines (generally, several μnanoseconds).

Figure 12:
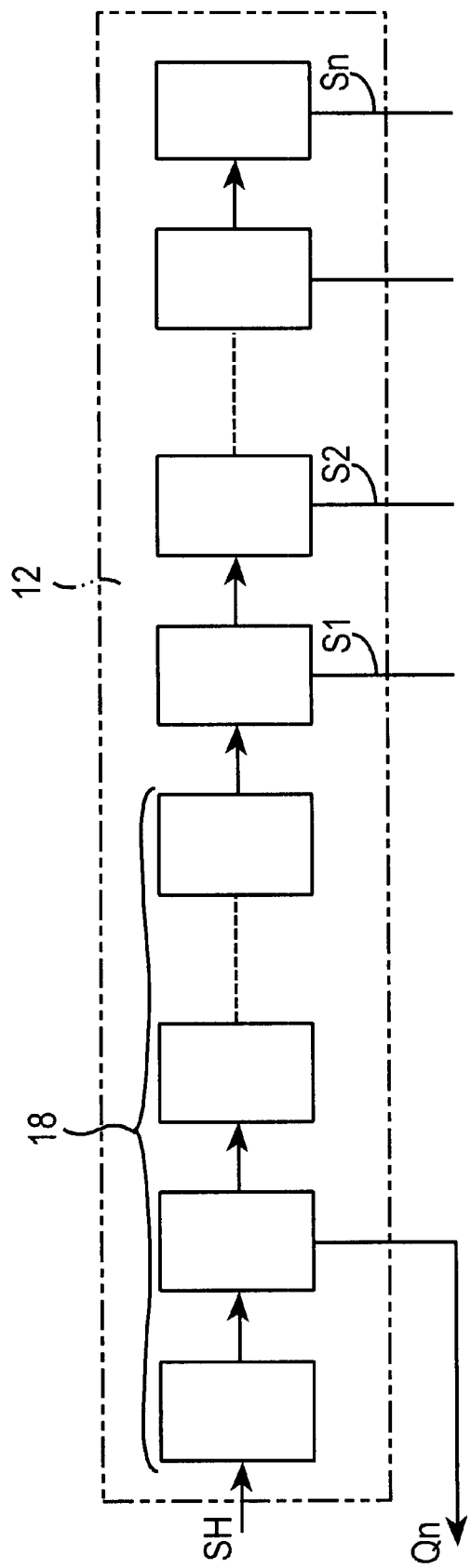
FIG. 12 is a diagram showing another structure to delay an output signal Qn.

In place of the delay circuit 20, a plurality of dummy stages 18 may be provided in the shift register as shown in FIG. 12 so as to adjust the latch timing.

Although the image signal side driver circuit is an external circuit in the present embodiment, it can be an internal circuit like the scanning side driver circuit. In that case, the normal phase and reverse phase scanning side clock signals CV1 and CV2 have a skew period shorter than the period of the image signal side clock signal CH, so that the image signal side clock signal CH may be used as the latch pulse. Alternatively, the start signal or the output signal of the shift register may be used like in the present embodiment. As the image signal side driver circuit 6, one of the driver circuits shown in Embodiments 3 through 8 below can be used so as to enter only a single phase clock signal. This structure makes it possible to prevent the fail phenomenon due to a clock skew in the same manner as the scanning side driver circuit, and eventually to realize circuit operations with no malfunctions.

EMBODIMENT 3

Figure 13:
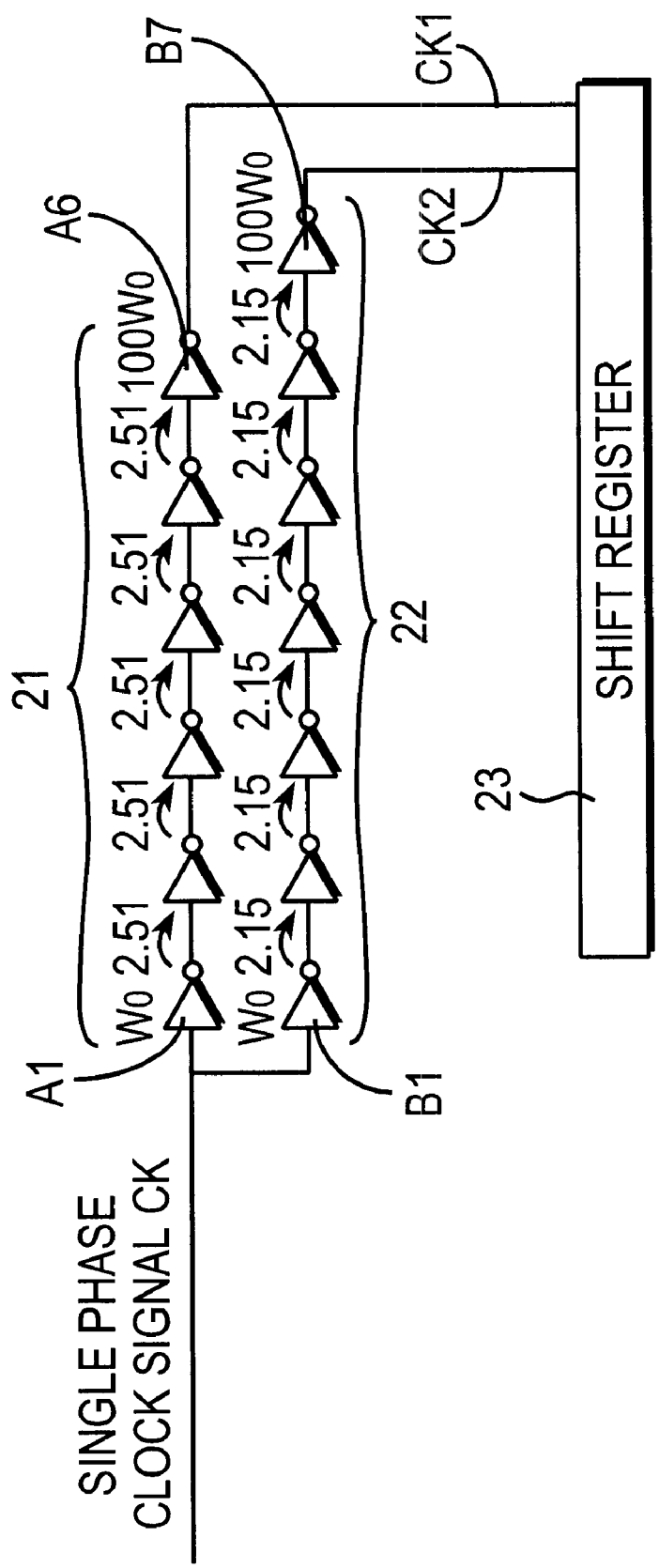
FIG. 13 is a circuit showing the structure of the main part of the driver circuit of Embodiment 3.

FIG. 13 is a diagram showing the structure of the main part of the driver circuit of Embodiment 3. The feature of the driver circuit of Embodiment 3 is that the normal phase and reverse phase clock signals CK1 and CK2 having no clock skew are generated from the single phase clock signal CK by using two inverter chain circuits. FIG. 13 shows a first inverter chain circuit 21, a second inverter chain circuit 22, and a shift register 23. The first and second inverter chain circuits 21 and 22 have different number of connected inverters from each other by one, so that their outputs are logical reverse to each other. The first inverter chain circuit 21 will enter the single phase clock signal CK and supply the normal phase clock signal CK1 to the shift register 23. The second inverter chain circuit 22 will enter the single phase clock signal CK and supply the reverse phase clock signal CK2 to the shift register 23.

The first and second inverter chain circuits 21 and 22 are structured as follows.

(1) The first inverter chain circuit 21 consists of six inverters A1–A6, and the second inverter chain circuit 22 consists of seven inverters B1–B7. A combination of six inverters and seven inverters corresponds to a combination of an even number of stages and an odd number of stages to minimize the input/output delay time of the inverter chain circuits which will be described later.

(2) In the first and second inverter chain circuits 21 and 22, the first-stage inverters A1 and B1 have the same transistor size, and the final-stage inverters A6 and B7 have the same transistor size. The transistor size refers to W/L where W is the gate width and L is the gate length of the transistors. Generally, L will be the shortest value determined in fabrication from both the area and the operation frequency, so it is W that is determined in design.

(3) In each of the first and second inverter chain circuits 21 and 22, the increase rate of transistor size is uniform between adjacent inverters. Furthermore, the increase ratio X of the final-stage inverter A6 or B7 to the first-stage inverter A1 or B1 is set at 100. In other words, letting the transistor size of the first-stage inverter A1 or B1 is W0, the transistor size of the final-stage inverter A6 or B7 is 100 W0. Consequently, letting the increase rate of the transistor size between adjacent inverters of the first inverter chain circuit 21 is k1, then k1=2.51, and letting the increase rate of the transistor size between adjacent inverters of the second inverter chain circuit 22 is k2, then k2=2.15.

The structure of the inverter chain circuits 21 and 22 described hereinbefore makes it possible to provide the shift register 23 with the normal phase and reverse phase clock signals CK1 and CK2 having little clock skew.

The reason for the successful generation of the normal phase and reverse phase clock signals CK1 and CK2 with little clock skew will be detailed as follows.

Figure 14:
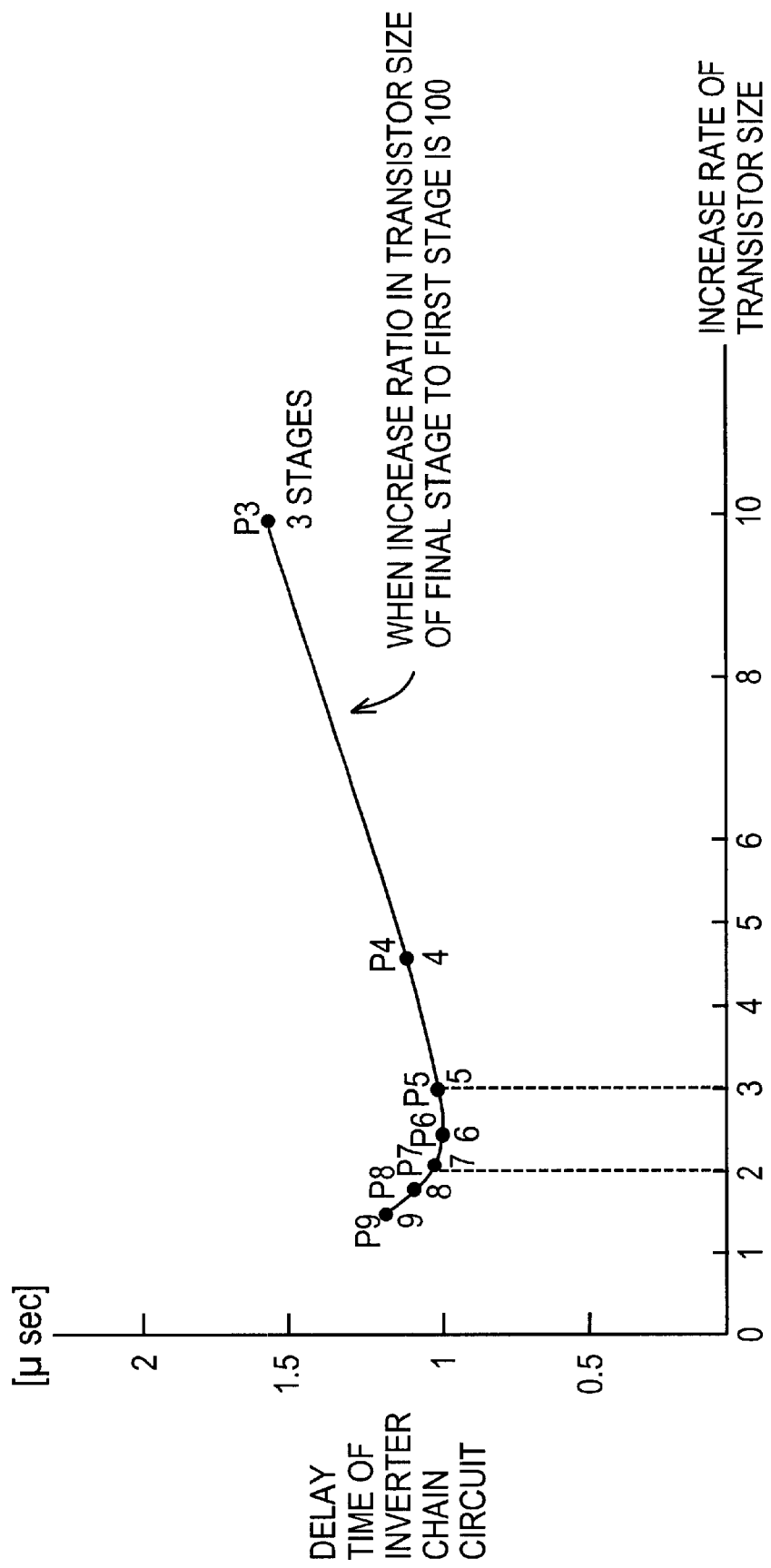
FIG. 14 is a graph showing the relationship between increase rate k of transistor size and input/output delay time in the inverter chain circuits.

As shown in FIG. 14, the relation between the number of connected inverters and the delay time of the inverter chain circuits indicates that there is a combination of the numbers inverters that makes the delay time minimum. The feature shown in FIG. 14 has been found by the inventors of the present invention through experiment. In FIG. 14, the increase ratio X of the final-stage inverter to the first-stage inverter is 100. The results also shows the presence of the minimum delay time even if the increase ratio X is other than 100.

Based on the feature shown in FIG. 14, the present embodiment sets the numbers of connected inverters of the first and second inverter chain circuits 21 and 22 at the combination that makes the minimum delay time.

The specific procedure of the experiment to obtain the results shown in FIG. 14 will be described. In the inverter chain circuits 21 and 22, the first-stage inverters are set to the same transistor size, the final-stage inverters are set to the same transistor size, and the increase ratio in transistor size of the final-stage inverter to the first-stage inverter is taken as X. The transistor size between adjacent inverters of each of the inverter chain circuits 21 and 22 is increased at a uniform rate. Letting the numbers of inverters of the inverter chain circuits are n and (n+1), the above-mentioned increase rates k1 and k2 of the first and second inverter chain circuits 21 and 22 become the 1/(n−1)th power of X and the 1/n-th power of X, respectively.

Then, the measurement of the input/output delay time of the inverter chain circuits is conducted under the conditions that the increase ratio X of the final-stage inverter to the first-stage inverter is taken as 100 and the number of connected inverters is set at an arbitrary value. The results of the measurement are plotted with the increase rate k at each number of inverters in the horizontal axis and the delay time of the inverter chain circuits at that time in the vertical axis (it is shown in relative time in FIG. 14). For example, when the number of inverters is three, the increase rate k1 becomes $100^{1/2}$, and the delay time of the inverter chain circuits at that time is measured so as to plot P3. The simulation is continued and the results are plotted to complete the graph of FIG. 14. In the graph, point P4 indicates the case of four inverters. Similarly, points P5, P6, P7, P8, and P9 indicate the cases of five, six, seven, eight, and nine inverters, respectively.

The graph shown in FIG. 14 indicates that the delay time is minimum when the numbers of the inverters at six and seven. Based on the results, the numbers of the inverters of the inverter chain circuits 21 and 22 are set to six and seven. In the six-stage inverter chain circuit 21, the increase rate k1 becomes the ⅕th power of 100 or 2.51. In the seven-stage inverter chain circuit 22, the increase rate k2 becomes the ⅙th power of 100 or 2.15. Thus, the inverter chain circuits 21 and 22 control the delay time between them to within several tens nanoseconds. As a result, the shift register 23 is supplied with the normal phase and reverse phase clock signals CK1 and CK2 having little clock skew, which prevents the occurrence of the fail phenomenon due to the clock skew.

The following is a detailed description of the mechanism to obtain the feature shown in FIG. 14. When the increase rate k of the transistor size becomes larger, large transistors (a large capacitive load) must be charged with small transistors (small current), which needs more charge time and eventually increases the delay time. When the increase rate k of the transistor size becomes smaller, on the other hand, less charge time is needed for each stage, but the number of stages increases. The charge time per stage has an inherent delay time other than 0 even when the increase rate k is 1, or the transistors of the same size are used for driving and loading. When the increase rate k is around 1, an increase in the number of stages is extremely large as compared with a decrease in the increase rate k, so that an increase in the total delay time due to the increase in the number of stages becomes larger than a decrease in the total delay time due to shortened charge time. Therefore, the delay time of the inverter chain circuits has a minimum value. The inventors of the present invention have conducted experiment based on the thoughts to find that there is a point where the total delay time becomes shortest when the increase rate k is around 2 to 3. The results of the experiment are the graph of FIG. 14. The results indicate that there is a combination between an even number of inverters and an odd number of inverters that makes the minimum delay time, and that the setting of the first and second inverter chain circuits 21 and 22 to the combination makes it possible to generate a normal phase and reverse phase clock signals having little skew.

Since the clock signal, which is supplied to every stage of the shift register, has a large load, it is inherently necessary to have a large current capacity by increasing the size of the transistors composing the inverters and other units in order to quicken the rising of the clock signal on each stage. From the viewpoint of circuit design, the provision of the first and second inverter chain circuits 21 and 22 has the effect of supplying the shift register not only with a normal phase and reverse phase clock signals having no skew but also with a clock signal having improved current capacity inherently required. In the present embodiment, variations in transistor performance caused during manufacturing do not affect the minimum delay time because all the transistors in the inverter chain circuits 21 and 22 have variations as well. Consequently, a clock skew can be reduced regardless of the variations in the transistor performance, which prevents the fail phenomenon.

The present embodiment can be applied to both the image signal side driver circuit and the scanning side driver circuit.

EMBODIMENT 4

Figure 15:
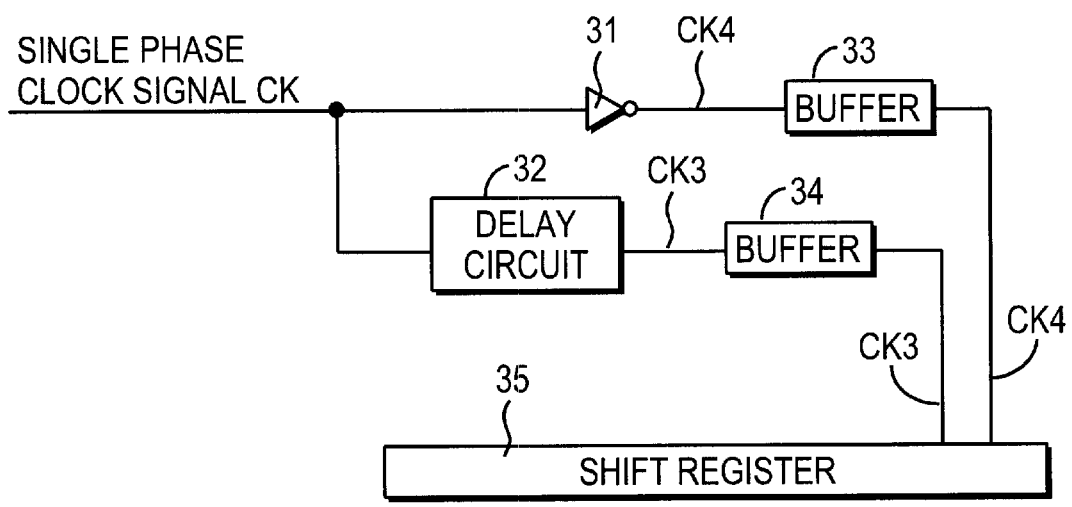
FIG. 15 is a diagram showing the structure of the main part of the driver circuit of Embodiment 4.

FIG. 15 is a diagram showing the structure of the main part of the driver circuit of Embodiment 4. The diagram shows an inverter 31, a delay circuit 32 having the same delay time as the inverter 31 and not performing logical reverse at its input/output terminals, buffers 33 and 34, and a shift register 35. The delay circuit 32 can be composed of a transfer gate or internal resistance (resistance of semiconductor layers composed of ion-doped polycrystalline silicon). In the structure, a reverse phase clock signal CK4, which is the reverse of a single phase clock CK, becomes the output of the inverter 31. A normal phase clock signal CK3 having the same phase as the single phase clock CK, on the other hand, becomes the output of the delay circuit 32. Since the delay circuit 32 has the same length of delay time as the inverter 31, there is no clock skew between the reverse phase clock signal CK4 and the normal phase clock signal CK3. As a result, the shift register 35 is supplied with the normal phase and reverse phase clock signals CK3 and CK4 having no skew, which prevents the occurrence of the fail phenomenon due to a clock skew.

The present embodiment can be applied to both the image signal side driver circuit and the scanning side driver circuit.

EMBODIMENT 5

Figure 16:
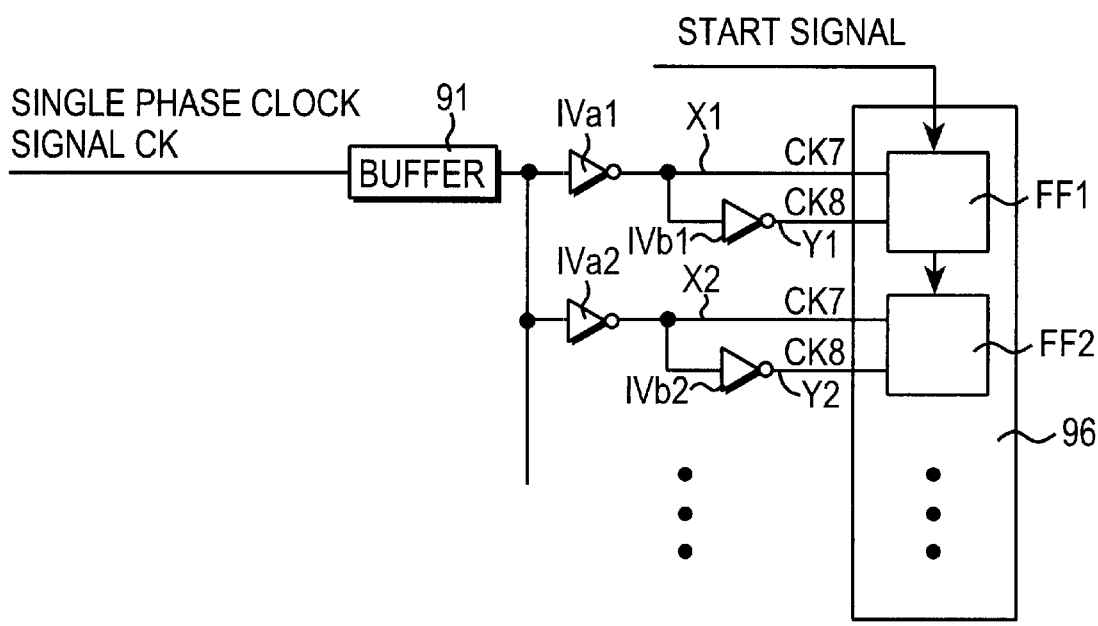
FIG. 16 is a diagram showing the structure of the main part of the driver circuit of Embodiment 5.

FIG. 16 is a diagram showing the structure of the main part of the driver circuit of Embodiment 5. The driver circuit comprises, for each stage of the shift register, a first clock signal supply line supplying one of a normal phase and reverse phase clock signals and a second clock signal supply line, which branches off from the first clock signal supply line and is provided with an inverter at a midpoint in the second clock signal supply line so as to supply the other clock signal. In the structure, the delay time of the inverter is reduced by having a small load capacity to be connected to the inverter, which realizes a reduction in the clock skew between the normal phase and reverse phase clock signals.

The structure of the present embodiment will be described with reference to FIG. 16. FIG. 16 shows a buffer 91, a shift register 96, inverters IVa1, IVb1, IVa2, and IVb2, a first stage FF1 and a second stage FF2 of the shift register 96. The entire stages are collectively referred to as stages FF. There are first clock signal supply lines X1 and X2, and second clock signal supply lines Y1 and Y2 which branch off from the first clock signal supply lines X1 and X2, respectively. The inverters Ivb1 and Ivb2 are provided at a midpoint in the second clock signal supply lines Y1 and Y2, respectively. Although FIG. 16 shows only the components related to the first stage FF1 and the second stage FF2, the same components are provided on and after the third stage of the shift register 96.

The following is a description of the operations to reduce a clock skew in the driver circuit of the present embodiment. Firstly, the single phase clock signal CK is entered into each inverter (IVa1, IVa2, and so on) at each stage of the shift register via the buffer 91. A reverse phase clock signal CK7 sent from the inverter IVa1 is reversed by the inverter IVb1 to generate a normal phase clock signal CK8, which is supplied to the first stage FF1 through the second clock signal supply line Y1. In that moment, a clock skew is caused between the normal phase and reverse phase clock signals CK7 and CK8 by the delay time of the inverter IVb1; however, the clock skew is not so influential as to affect the stable operation of the shift register 96. The same operations as on the first stage FF1 are performed on and after the second stage FF2, so that clock skews caused in the same way as on the first stage FF1 do not affect the stable operation of the shift register 96. As a result, the shift register 96 performs stable operations with no fail phenomenon.

The reason of the clock skew between the clock signals CK7 and CK8 being in the range of securing the stable operation of the shift register 96 will be described in detail in comparison with a conventional driver circuit.

Figure 27:
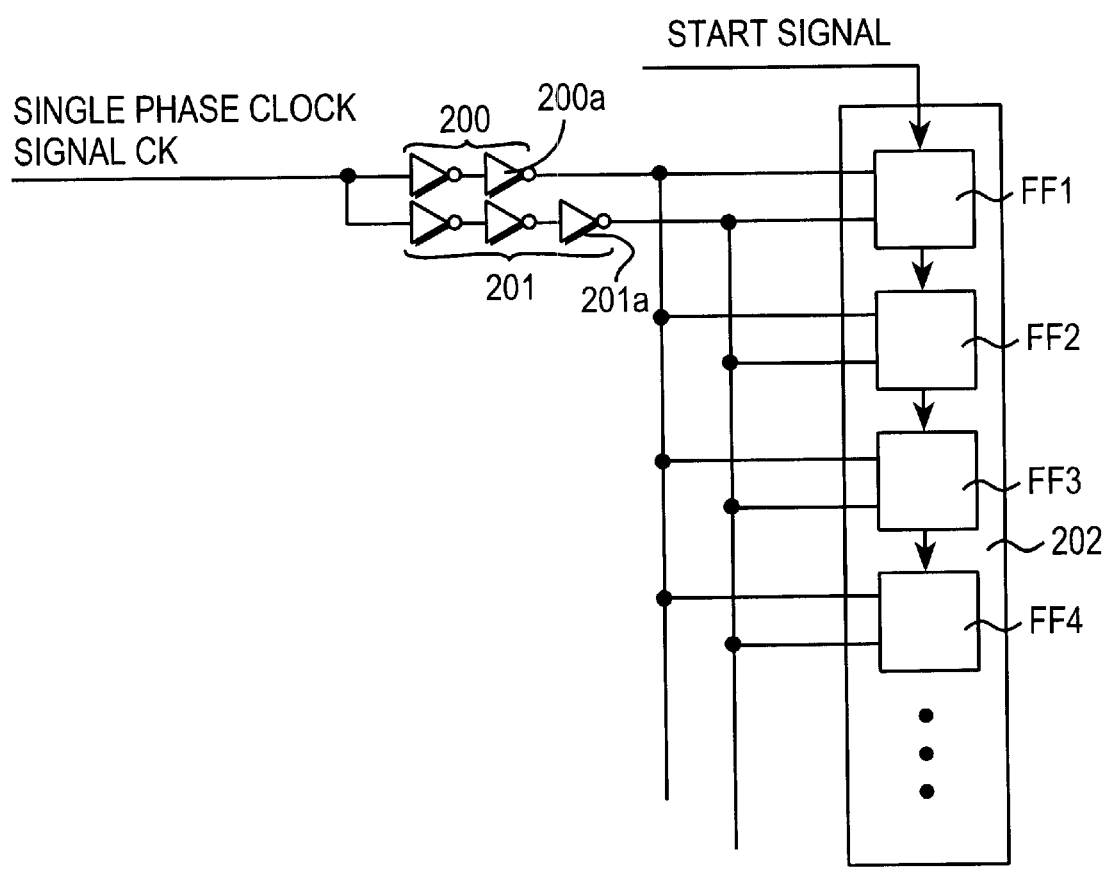
FIG. 27 is a diagram showing the structure of the main part of the conventional driver circuit.

In the conventional driver circuit shown in FIG. 27, a single phase clock signal CK is converted into a normal phase clock signal having the same phase as the single phase clock signal CK via an inverter chain 200 having an even number of stages. The single phase clock signal CK is also converted into a reverse phase clock signal via an inverter chain 201 having an odd number of stages. Consequently, the normal phase and reverse phase clock signals are supplied to all the stages FF of a shift register 202. Therefore, the final-stage inverter 200a of the inverter chain 200 for the normal phase clock signal and the final-stage inverter 201a of the inverter chain 201 for the reverse phase clock signal are each connected, as a capacitive load, to all the stages FF of the shift register. In contrast, in the present embodiment, the inverters IVa1, IVa2 and so on (the entire inverters are collectively referred to as IVa) corresponding to the final-stage inverter 200a on the normal phase clock signal side and the inverters IVb1, IVb2 and so on (the entire inverters are collectively referred to as IVb) corresponding to the final-stage inverter 201a on the reverse phase clock signal side are each connected, as a capacitive load, to only one stage of the shift register.

In short, each final-stage inverter of the conventional driver circuit has an extremely large capacitive load whereas the capacitive load for each final-stage inverter in the present embodiment is very small. This difference reduces the clock skew between a normal phase and reverse phase clock signals supplied to the shift register in the present embodiment.

The reason for the successful reduction in clock skew will be described as follows.

The final-stage inverters IVa each drive a load for one stage and also drive the inverters IVb. The input capacities of the inverters IVb are so small that they are ignored in the following description, which does not cause any intrinsic difference. Assume that the inverters IVa and the inverters IVb are composed of transistors having approximately the same size.

Figure 17:
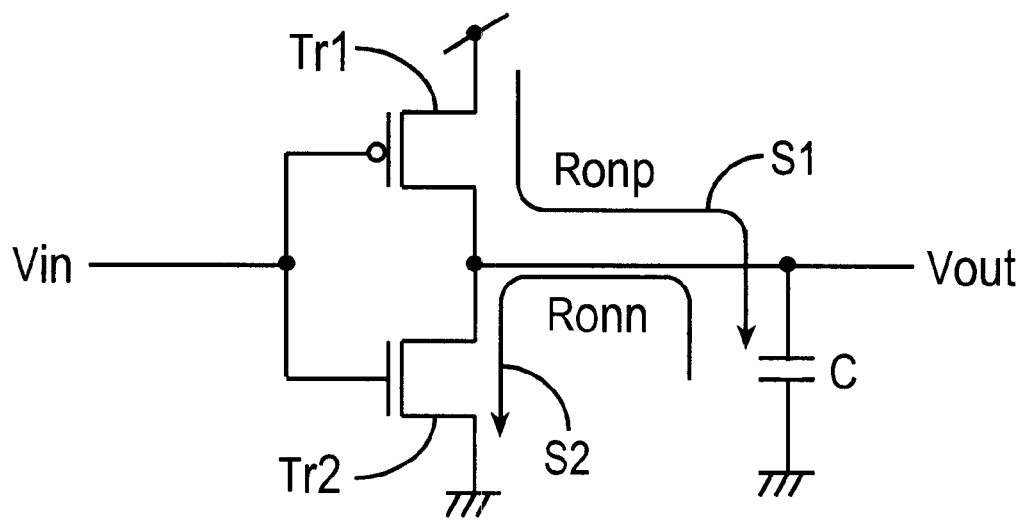
FIG. 17 is a diagram explaining charge/discharge operations of the inverters.

It is charge/discharge operations of the final-stage inverters that is directly related to the fail phenomenon due to the skew between the clock signals in the shift register. The charge/discharge operations of the final-stage inverters IVa and IVb depend on time constants $\tau=C \cdot R$, wherein C represents a load capacity and R represents the resistance of inverters. To be more specific, as shown in FIG. 17 the resistance R means the ON resistance Ronp of P-channel transistor Tr1 during a capacity charge, and also means the ON resistance Ronn of N-channel transistor Tr2 during a capacity discharge. The ON resistance Ronp and the ON resistance Ronn are not the same resistance value, but slightly different. This is because the transistors Tr1 and Tr2 composed of polycrystalline silicon have variations in performance in the present fabrication process as compared with transistors composed of single crystalline silicon.

In view of the above-mentioned respects, comparisons are made between the normal phase clock signal CK7 supplied from the inverters IVa to the shift register 96 and the reverse phase clock signal CK8 supplied from the inverters IVb to the same shift register. Assumed that the inverters IVa each enter a normal phase clock signal (which means the inverters IVa each output a reverse phase clock signal). At that moment, the current flows in the direction of arrow Si in the inverters IVb, so that the rising of the pulse depends on time constant $\tau 1 = C \cdot Ronp$. In the inverters IVa, on the other hand, the current flows in the direction of arrow S2, so that the falling of the pulse depends on time constant $\tau 2 = C \cdot Ronn$.

Since Ronp≠Ronn, the time constant $\tau 2 = C \cdot Ronp$ and the time constant $\tau 2 = C \cdot Ronn$ have a larger difference with increasing load capacity C. While the conventional driver circuit shown in FIG. 27 has the load capacities corresponding to all the stages, the connection structure of the present embodiment shown in FIG. 16 has a load capacity corresponding to only one stage. This structure makes the difference between the time constant $\tau 1 = C \cdot Ronp$ and the time constant $\tau 2 = C \cdot Ronn$ extremely small. This indicates that the clock skew between the normal phase and reverse phase clock signals CK7 and CK8 to be entered into the shift register 96 is considerably reduced in the present embodiment, as compared with the conventional driver circuit. As a result, the clock skew between the clock signals CK7 and CK8 is so controlled as to secure the stable operation of the shift register 96.

If the load capacities are equal, the smaller the resistance R of the inverters, the shorter the delay time becomes, which leads to a reduction in clock skew. Consequently, larger inverters are preferable. However, large inverters not only increase power consumption but also failing to achieve the minimization of the area occupied for the driver circuit near a liquid crystal display unit in a liquid crystal display panel. Taking the layout area for the driver circuit into account, it is preferable that the transistor size W/L of the shift register 97 and the inverters IVb is set around 1. When the transistor size W/L=1, it becomes possible to reduce clock skew, power consumption, and the area for the driver circuit in a liquid crystal display panel.

The inventors of the present invention have assembled the driver circuit of the present embodiment, setting the transistor size W/L of the shift register 97 and the inverters IVb at 1, and measured clock skew at each stage to verify that the shift register 97 performs stable operations without any trouble, only having clock skew of 10 nanoseconds.

For reference, a reduction in the connection number of the load capacity is more effective to reduce clock skew than a change in size of the inverters. This is because the possible range of changes in the inverter size is only about 10 times, which does not offer substantial effects for the reduction in clock skew; however, if the reduction in the connection number of the load capacity is applied to a large-scale liquid crystal display panel having several hundred stages of load capacity connected, one-several hundredths of the effects can be exerted.

Figure 18A:
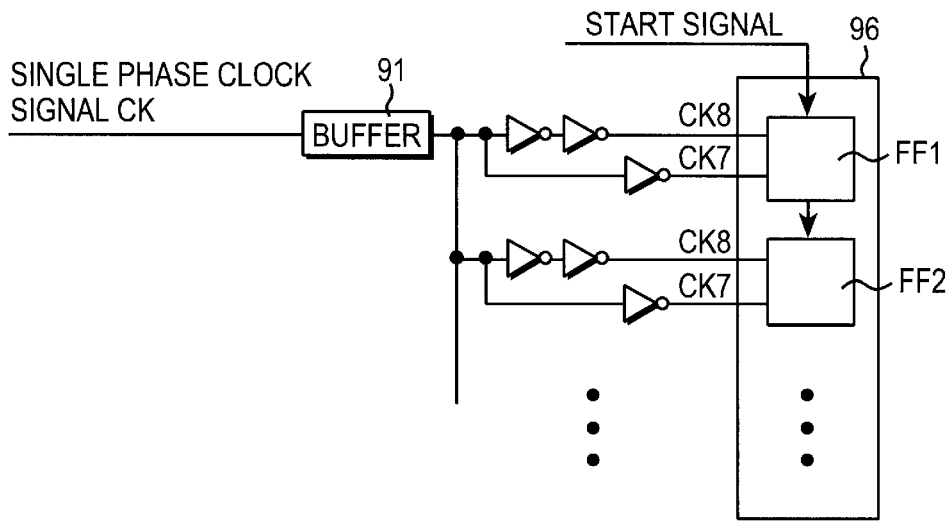
FIGS. 18(a)–18(c) are diagrams showing other driver circuits of Embodiment 5.

The driver circuit of the present embodiment is not restricted to the structure shown in FIG. 16 but can be that shown in FIG. 18(a).

Figure 18B:
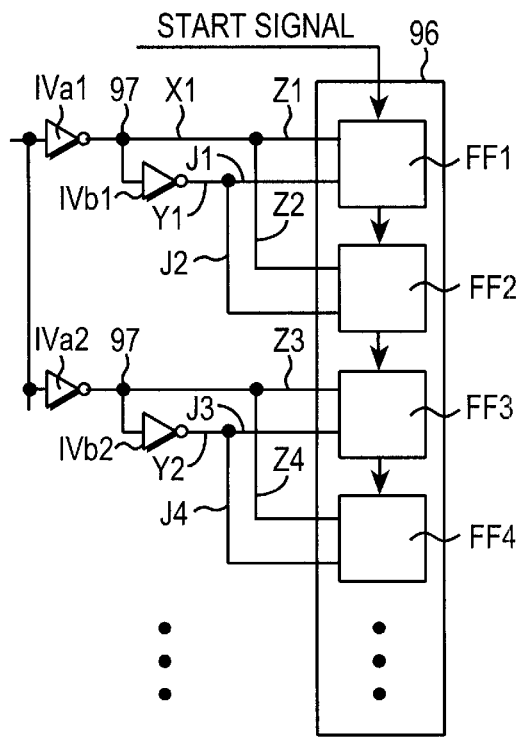
Figure 18C:
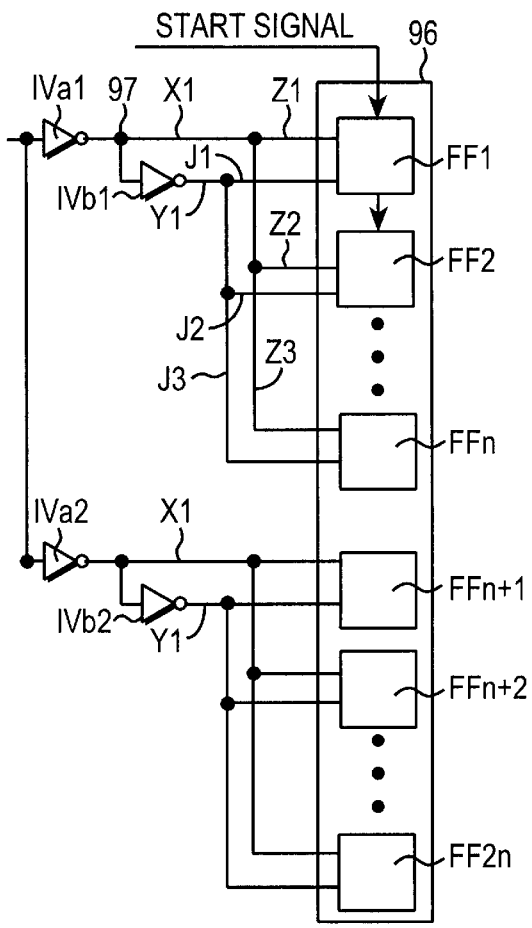

Although the inverters IVb which generate the normal phase and reverse phase clock signals are each provided for every stage of the shift register 96 in the present embodiment, they may be provided each for a plurality of stages as shown in FIGS. 18(b) and 18(c).

In short, the driver circuit of the present embodiment may comprise at least the following components ①-⑤. ① The entire stages FF composing the shift register 96 are divided into groups. Each stage group comprises ② a first clock signal supply line X, ③ a second clock signal supply line Y which branches off from the first clock signal supply line X and is provided with an inverter IVb at a midpoint in the line Y, ④ first individual connection lines Z1, Z2 and so on (refer to FIGS. 18(b) and 18(c)) (the first individual connection lines are collectively referred to as Z) which branch off from the first clock signal supply line X as many as the stages in each group after the branch point 97 (refer to FIGS. 18(*b*) and 18(*c*)) of the second clock signal supply line Y so as to be connected to either one of the clock signal input terminals, and ⑤ second individual connection lines J1, J2 and so on (refer to FIGS. 18(*b*) and 18(*c*)) (the second individual connection lines are collectively referred to as Z) which branch off from the second clock signal supply line Y as many as the stages in each group so as to be connected to the other of the clock signal input terminals.

As shown in FIGS. 16 and 18(*a*), when the entire stages FF in the shift register 96 are divided into groups each consisting of a single stage, the first and second individual connection lines Z and J are replaced, respectively, by the first clock signal supply line X directly connected with either one of the clock signal input terminals and the second clock signal supply line Y directly connected with the other one of the clock signal input terminals.

Providing the inverters IV*b* one for a plurality of stages as shown in FIGS. 18(*b*) and 18(*c*) has an advantage of reducing the number of transistors. However, as the number of stages in one group increases, each inverter provided for the increased stages is required to charge and discharge more load capacity of the shift register 96, which causes an increase in clock skew. Therefore, the most appropriate number of stages may be selected to secure the stable operations of the shift register, depending on the size and use of the liquid crystal display panel and other requirements.

Since the buffer 91 is provided for the purpose of making the single phase clock signal CK drive the load of each of the inverters IV*a*, it may be eliminated if the single phase clock signal CK has a sufficient current capacity.

The present embodiment can be applied to both the image signal side driver circuit and the scanning side driver circuit.

SECOND INVENTION GROUP

The second group of inventions has achieved the prevention of the occurrence of the fail phenomenon by enlarging the maximum clock skew permitted by the shift register. The specific methods of increasing the maximum clock skew are as follows: ①increasing time constant, ② increasing a threshold voltage, and ③ delaying the timing of an input potential to start to change in a skew period.

The second group of inventions will be described in Embodiments 6 through 8 as follows.

EMBODIMENT 6

Embodiment 6 prevents the occurrence of the fail phenomenon by increasing time constant and eventually increasing the maximum clock skew permitted by the shift register.

Figure 19:
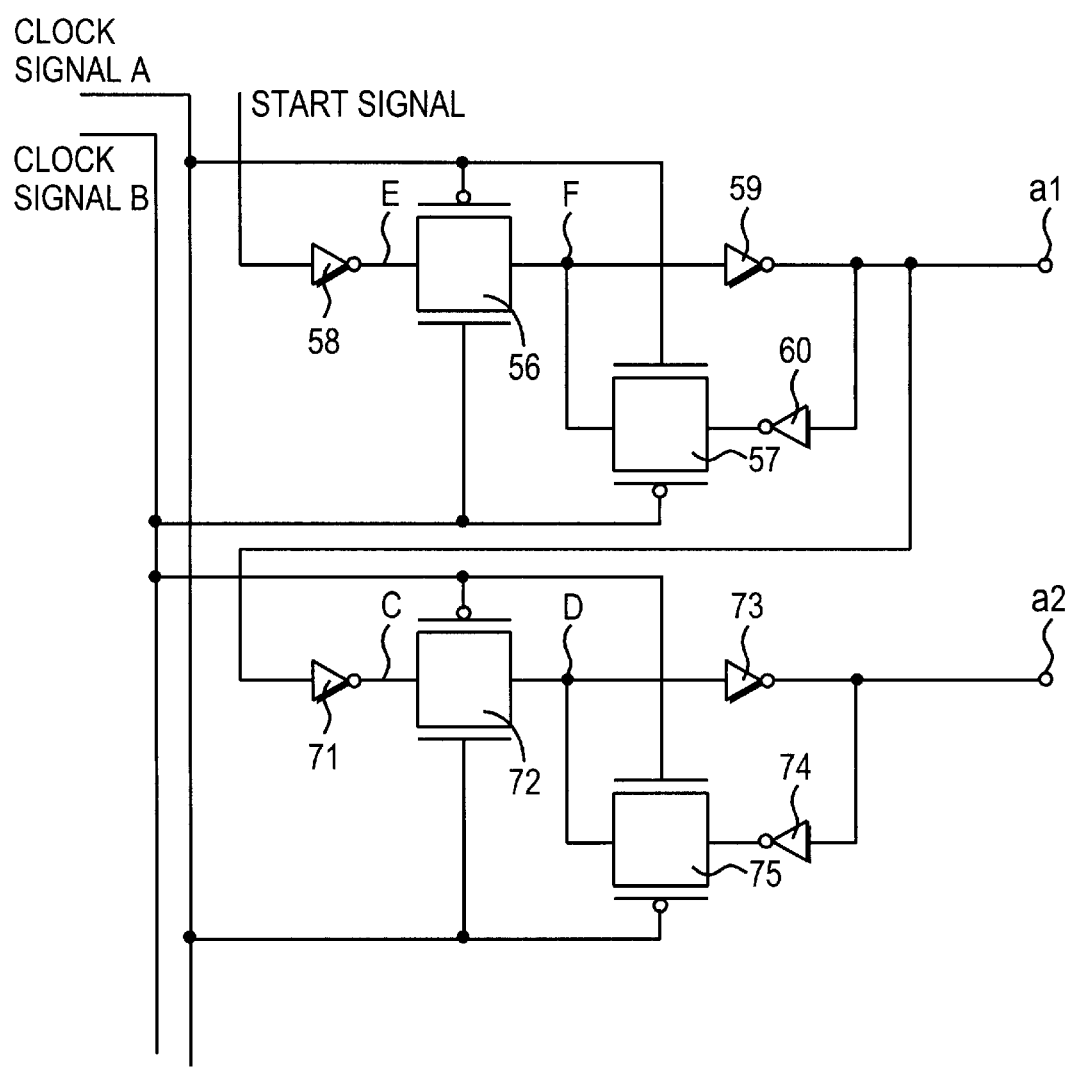
FIG. 19 is a diagram showing the structure of the main part of the driver circuit of Embodiment 6.

FIG. 19 is a diagram showing the structure of the main part of the driver circuit of Embodiment 6, and FIGS. 20(*a*)–20(*d*) show the timing charts. The feature of the present embodiment lies in the structure of the shift register, so that the following description will be focused on the circuit structure of the shift register. Since the fail phenomenon occurs on or after the second stage of the shift register, only the circuit structure of the second stage is shown. The remaining stages have the same structure as the second stage.

The shift register of the present embodiment has basically the same structure as the shift register shown in FIG. 1; the second stage of the shift register comprises a first inverter 71 for entering the output of the first stage, a second inverter 73 for entering the output of the first inverter 71 and for outputting, as the output signal of the shift register, a reverse signal, which is the reverse of the output of the first inverter 71, and a third inverter 74 disposed between the input side and output side of the second inverter 73 so as to form a closed circuit in collaboration with the second inverter 73. On the output side of the first inverter 71 provided a transfer gate 72 as a first switching means for conducting and interrupting the output of the first inverter 71. The closing and opening of the transfer gate 72 is controlled by a normal phase and reverse phase clock signals A and B. On the output side of the third inverter 74 provided a transfer gate 75 as a third switching means for conducting and interrupting the output of the third inverter 75. The closing and opening of the transfer gate 75 is controlled by the normal phase and reverse phase clock signals A and B.

As shown in FIGS. 20(*a*) and 20(*b*),in the skew period Ts where both the clock signals A and B are LOW, a node C entered into the transfer gate 72 makes a LOW to HIGH transition as shown in FIG. 20(*c*), so that the transfer gate 72 tries to reverse an output node D from LOW to HIGH. The transfer gate 75, on the other hand, tries to hold the node D LOW, but it is impossible because the N-channel transistor of the transfer gate 75 has not been in ON yet. Consequently, the potential of the node D continues to rise in the skew period Ts as shown in FIG. 20(*d*). In the present embodiment, the maximum permissible clock skew is increased by expanding the time Tth for the potential of the node D to reach the threshold voltage Vt of the inverter 73 so as to reverse the output (the fail phenomenon occurs), that is, by increasing the time constant when the transfer gate 72 charges or discharges the gate capacity of the inverter 73.

To be more specific, the maximum permissible clock skew is increased according to either one or both of the structures (a) and (b) described below. Assume that the transistor size of the inverters 71 and 74 and the transfer gate 75 is set at 1.

(a) First Structure

In order to increase the ON resistance of the transfer gate 72, the transistor size of the transfer gate 72 is made equal to or smaller than that of the transfer gate 73.

(b) Second Structure

In order to increase the input capacity of the inverter 73, the inverter 73 may have a larger transistor size than the transistors around it (the inverters 71 and 74 and the transfer gate 75), or a supplementary capacity may be provided to the gate of the inverter 73.

It should be noted that the upper limit of the time constant is within the range of the operation frequency of the shift register. This is because too large a time constant results in too moderate changes in the potential of the node D, which makes it impossible for the changes to follow the operation frequency of the shift register outside the skew period in which the fail phenomenon becomes a problem, and eventually interferes with normal operations.

According to either one or both of the structures (a) and (b), the occurrence of the fail phenomenon is prevented by increasing the time constant τ at which the potential of the node D reaches the threshold voltage Vt of the inverter 73, which eventually increases the maximum permissible clock skew. The reason for this will be detailed as follows. Letting the time constant τt when the potential of the node D reaches the threshold value vt after a lapse of the skew period Ts is τt, when the time constant τ1 is smaller than the time constant τt, the potential of the node D rises so rapidly as shown in line M1 of FIG. 20(*d*) that it reaches the threshold voltage Vt in the skew period Ts, causing the fail phenomenon. The maximum permissible clock skew T1 at that moment is shorter than the skew period Ts.

When the time constant τ2 is larger than the time constant τt as in the present embodiment, the potential of the node D rises too slow as shown in line M2 of FIG. 20(d) to reach the threshold voltage Vt in the skew period Ts, which causes no fail phenomenon. At that moment, the maximum permissible clock skew T2 becomes longer than the skew period Ts.

In the general shift register shown in FIG. 1, the transistor size of the inverters 51 and 54 and the transfer gates 52 and 55 is set at 1, and the transistor size of the inverter 53 is set around 1.5 to 2. This is because the transistor size is so determined as to have a smaller area, less power, and higher operation frequency in designing the shift register. The minimum unit of the transistor from the viewpoints of area and power is basically a square size of W/L=1. The minimum unit may be set at W/L>1 when the transistor has a small current capacity. Increasing the operation frequency is equivalent to minimizing the delay time at each stage. The operations of the shift register consist of the driving of the inverter 53 by the inverter 51 and the transfer gate 52 and by the inverter 54 and the transfer gate 55. Since the clock driver driving these gates has restrictions (heavy loads due to as many as hundreds of stages), the transistor size of the transfer gates 52 and 55 is usually made the minimum unit, which does not affect the frequency because these gates have only a small delay. The transistor size of the inverters 51 and 54, on the other hand, is made the minimum unit because they have only the inverter 53 as a load. The inverter 53 has a little larger transistor size because it has the inverter 54 and the inverter on the next stage as loads; to be more specific, the transistor size W/L of the inverter 53 is best set around one or two times the minimum unit from the viewpoints of area, power, and frequency. From the viewpoint of design, the transistor size of the inverters 51 and 54, the transfer gates 52 and 55 of the ordinary shift register is set at 1 and the transistor size of the inverter 53 is set around one or two times the minimum unit.

Consequently, in the shift register of the present embodiment, the transistor size of the inverter 73 (corresponding to the inverter 53 shown in FIG. 1) must be set over one or two times the minimum unit, as compared with the ordinary shift register shown in FIG. 1.

The present embodiment can be applied to both the image signal side driver circuit and the scanning side driver circuit. However, it is more effective to be applied to the scanning side driver circuit because the low-speed operations of the scanning side shift register allows the transistor size W/L to be largely different. The inventors of the present invention have found through experiment that when the transistor size W/L of the transfer gate 72 is 1 and that of the inverter 53 is as large as 100, operations at 15.75 kHz is possible. At that moment, the permissible skew is 1 μs, which is an increase of about 15 times. When the present embodiment is applied to the signal side shift register, on the other hand, operations are conducted with frequencies close to the limit of the transistors, so that the flexibility is not so large as in the scanning side driver circuit. According to the experiment, when the transistor size W/L of the transfer gate 51 is 1 and that of the inverter 53 is 10, the permissible skew doubles to 120 nanoseconds. It has been shown by the experiment that the present embodiment is applicable to the image signal side driver circuit.

The transistor size W/L of the inverter 71 is 1 in the present embodiment; however, it is needless to say that decreasing the charge capacity to, for example, 0.5 has the same effect as increasing the transistor size W/L of the inverter 73.

EMBODIMENT 7

Embodiment 7 prevents the occurrence of the fail phenomenon by increasing threshold voltage and eventually increasing the maximum clock skew permitted by the shift register.

Figure 21:
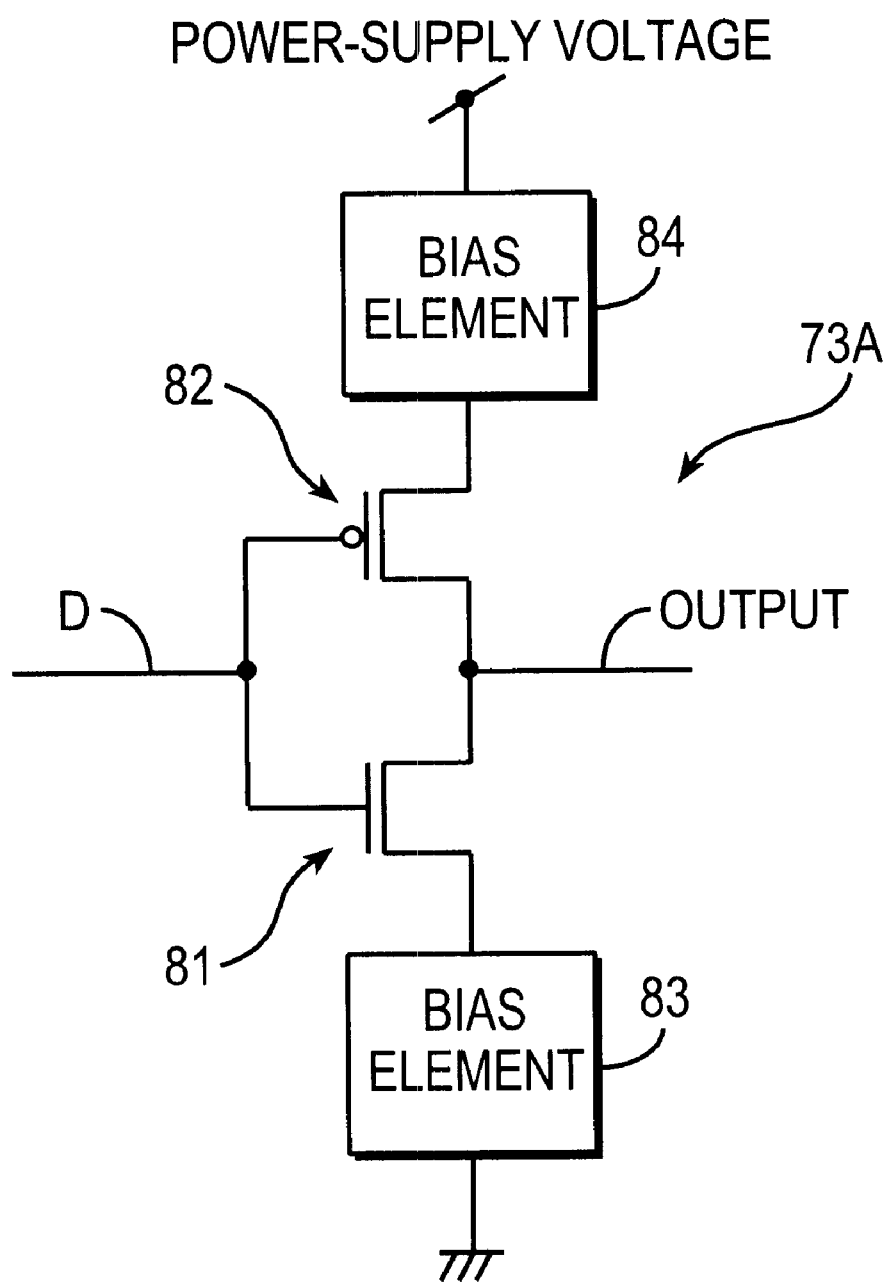
FIG. 21 is a diagram showing the structure of the main part of the driver circuit of Embodiment 7.

FIG. 21 is a diagram showing the structure of the main part of the driver circuit of Embodiment 7, and FIGS. 22(a)–22(e) show the waveforms of the signals. In the present embodiment, in order to increase the maximum clock skew permitted by the shift register, input voltage is so arranged between the power-supply voltage and the grounding voltage as to be far from both in the switching operations of the second inverter 73, thereby increasing the effective value of the threshold voltage of the inverter 73.

To be more specific, the inverter 73 is replaced by an inverter 73A provided with bias elements as shown in FIG. 21; a bias element 83 is provided between the transistor 81 and the grounding potential, and a bias element 84 is provided between the transistor 82 and the power-supply potential. The provision of these bias elements increases the threshold voltage of the inverter 73A. Consequently, in the inverter 73 not provided with the bias elements 83 and 84 shown in FIG. 22(d), the potential of the node D reaches the threshold voltage Vt1 in the skew period Ts to cause the fail phenomenon. The maximum permissible clock skew T3 at that moment is shorter than the skew period Ts.

In contrast, in the inverter 73A with the bias elements 83 and 84, the threshold voltage becomes substantially Vt' (obtained by adding a bias voltage of the bias element to the voltage Vt). Consequently, as shown in FIG. 22(e), the potential of the node D does not reach the threshold voltage Vt' in the skew period Ts, which causes no fail phenomenon. The maximum permissible clock skew T4 at that moment is longer than the skew period Ts.

Since it takes longer for the potential of the node D to reach the potential to turn on the transistor 81 or 82, the maximum clock skew becomes larger. The bias elements can be composed of a MOS diode or the like. The provision of the bias elements may be replaced by a local increase in the threshold voltage of the transistors 81 and 82 composing the inverters.

EMBODIMENT 8

Embodiment 8 prevents the occurrence of the fail phenomenon by delaying the timing of input voltage to start to change in a skew period and eventually increasing the maximum clock skew permitted by the shift register.

Figure 23:
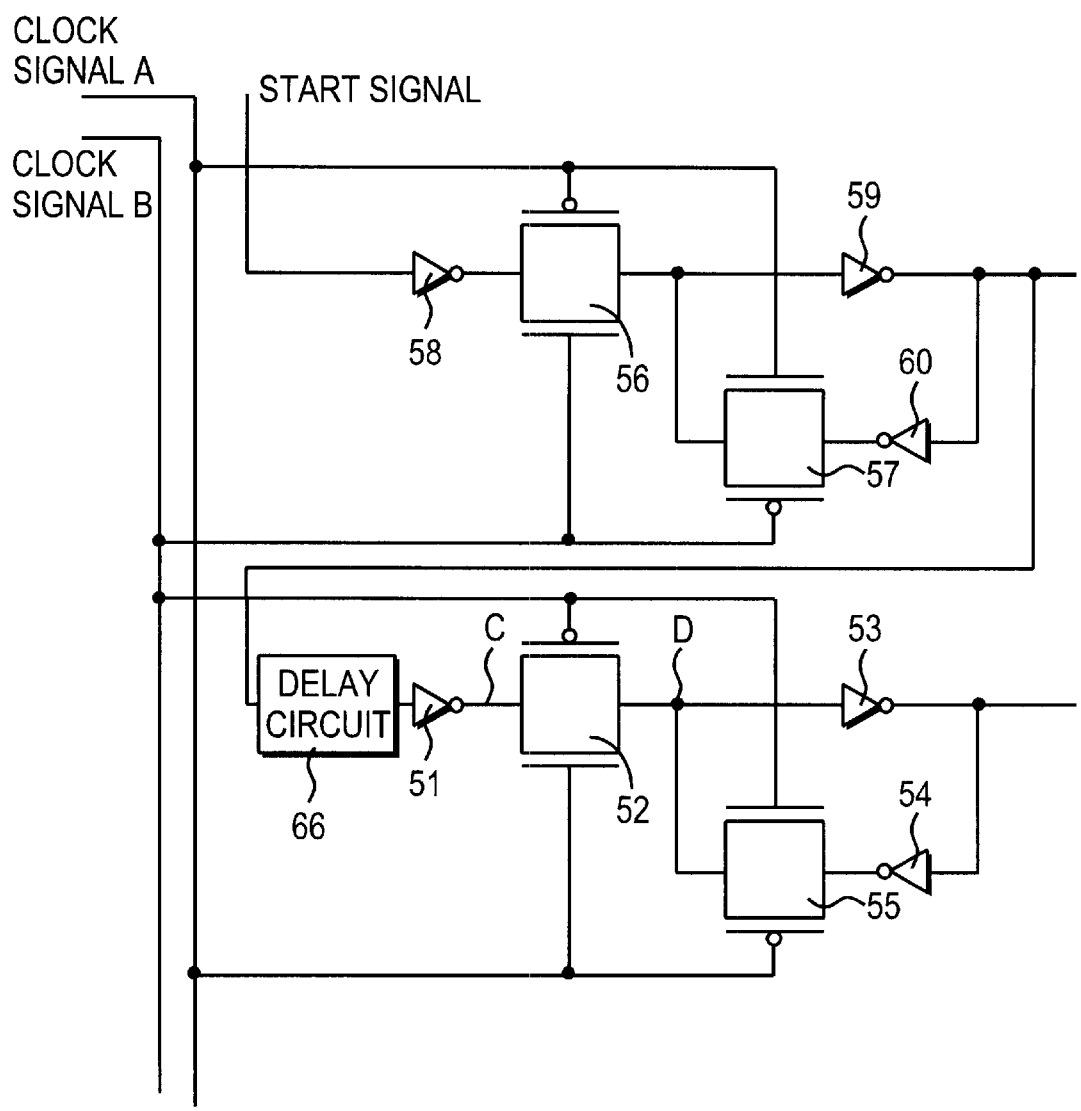
FIG. 23 is a diagram showing the structure of the main part of the driver circuit of Embodiment 8.

FIG. 23 is a diagram showing the structure of the main part of the driver circuit of the present embodiment, and FIGS. 24(a)–24(d) are timing charts of the circuits. The driver circuit of the present embodiment comprises delay circuits 66 each provided between adjacent stages of the shift register shown in FIG. 1. The delay circuits 66 may be inverter chains consisting of an even number of stages, causing no logical reverse in input/output.

Figure 24:
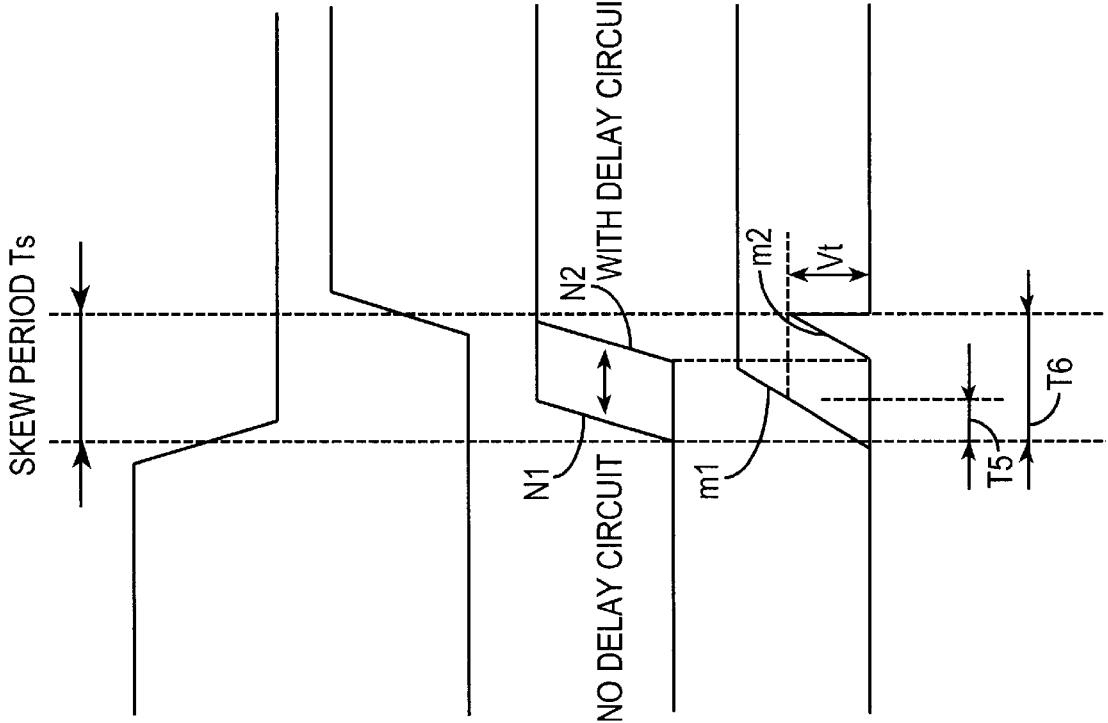
FIGS. 24(a)–24(d) are waveforms explaining operations of the driver circuit of Embodiment 8 in a skew period.
Figure 25:
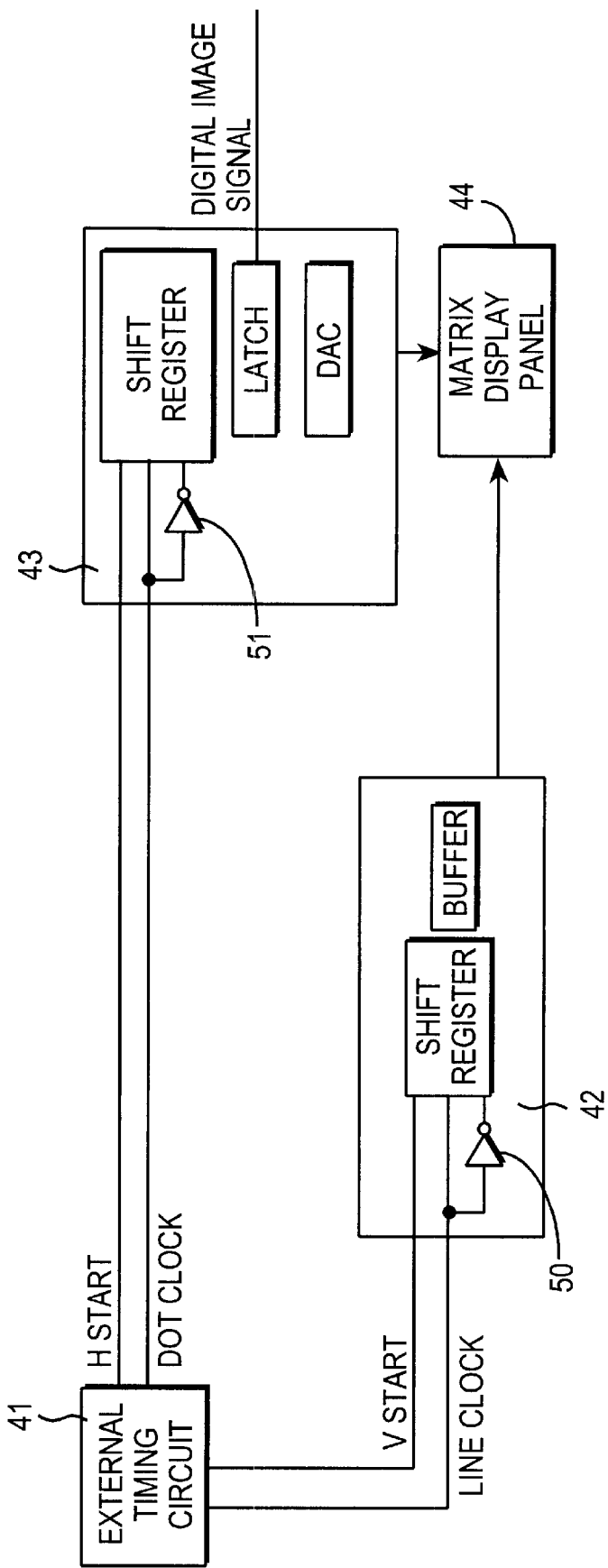
FIG. 25 is a diagram showing the entire structure of a conventional driver circuit.
Figure 26:
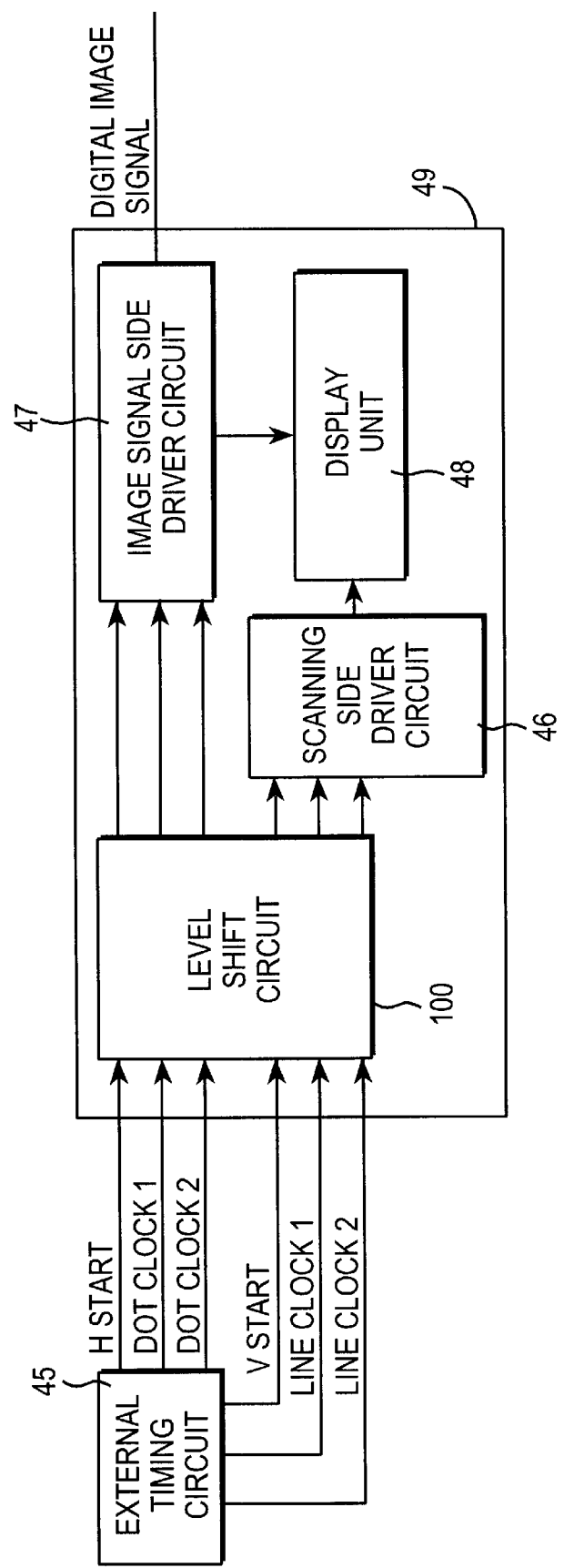
FIG. 26 is a diagram showing the entire structure of another conventional driver circuit.

Operations of the driver circuit will be described as follows with reference to FIGS. 24(a)–(d). As shown in FIGS. 24(a) and 24(b), when the node C which has been entered into the second-stage latch makes a LOW to HIGH transition in the skew period Ts where the clock signals A and B become LOW, the output node D is affected by the change in the node C and tries to make a LOW to HIGH transition. Thus, the node D follows the change in the node C in the skew period Ts. Since the time for the potential of the node D to reach the threshold voltage is the maximum permissible clock skew, the provision of the delay circuits 66 to the inputs on all the stages in the present embodiment delays the change in the node D in accordance with the change in the node C, and eventually increases the maximum permissible clock skew. Without the delay circuits 66, the node C rises like line N1 shown in FIG. 24(*c*), and the node D rises like line m1, following the rise of the node C. Consequently, the node D reaches the threshold voltage Vt in the skew period, which causes the fail phenomenon. In contrast, with the delay circuits 66 as in the present embodiment, the starting point of the node C to rise delays as shown in line N2 of FIG. 24(*c*). Consequently, the starting point of the node D to rise delays as shown in line m2 of FIG. 24(*d*), following the delay of the node C. As a result, the node D does not reach the threshold voltage Vt in the skew period TS, causing no fail phenomenon. The maximum permissible clock skew has extended from T5 to T6. In this manner, the occurrence of the fail phenomenon is prevented by providing the delay circuits 66, and eventually increasing the maximum permissible clock skew like Embodiments 6 and 7.

OTHERS (1) Although the shift registers in Embodiments 1 through 8 are a transfer gate type, they can be clocked C-MOS inverter type shift registers.

(2) It is possible to assemble a driver circuit for a liquid crystal display panel by employing the scanning side driver circuit of either Embodiment 1 or Embodiment 2 and one of the image signal side driver circuits of Embodiments 3 through 8. It is also possible to assemble a driver circuit for a liquid crystal display panel by combining any of the scanning side driver circuits in Embodiments 3 through 8 and any of the image signal side driver circuits of Embodiments 3 through 8.

(3) Although Embodiments 1 through 8 relate to the driver circuits for a liquid crystal panel only, the present invention is also applicable to all motion circuits having a shift register which is composed of polycrystalline silicon semiconductor layers and shifts a start signal in time with a normal phase and reverse phase clock signals.

(4) Besides the shift register, the present invention can be widely applied to motion circuits having a logical circuit such as a flip flop entering a normal phase and reverse phase clock signals to perform established operations as long as the motion circuit is composed of polycrystal silicone semiconductor layers.

What is claimed is:

1. An motion circuit which is composed of polycrystalline silicon semiconductor layers formed on a substrate and which has a logical circuit performing established operations by entering a normal phase clock signal and a reverse phase clock signal, said motion circuit comprising a clock skew reduction means for entering a normal phase clock signal and a reverse phase clock signal having a clock skew and for outputting a normal phase clock signal and a reverse phase clock signal having little clock skew therebetween to said logical circuit.

2. The motion circuit of claim 1, wherein said logical circuit is a shift register shifting a start signal entered in time with a normal phase clock signal and a reverse phase clock signal.

3. An motion circuit which is composed of polycrystalline silicon semiconductor layers formed on a substrate and which has a shift register entering a normal phase clock signal, a reverse phase clock signal, and a start signal and shifting the start signal in time with the normal phase clock signal and the reverse phase clock signal, said motion circuit comprising:

a first latch circuit for latching one of a normal phase clock signal and a reverse phase clock signal having a clock skew therebetween by using a latch pulse signal having a period equal to or smaller than a period of said one of a normal phase clock signal and a reverse phase clock signal and for outputting to said shift register; and a second latch circuit for latching an other one of the normal phase clock signal and the reverse phase clock signal having the clock skew therebetween by using the latch pulse signal and outputting to said shift register;

said first latch circuit and said second latch circuit performing latch operations to be timed to make said normal phase clock signal and said reverse phase clock signal have reverse polarities.

4. The motion circuit of claim 3 further comprising a circuit for generating said normal phase clock signal and said reverse phase clock signal from a single phase clock signal entered, for outputting one of said normal phase clock signal and said reverse phase clock signal to said first latch circuit, and for also outputting an other one of said normal phase clock signal and said reverse phase clock signal to said second latch circuit.

5. An motion circuit comprising a first motion circuit and a second motion circuit, said first motion circuit being composed of polycrystalline silicon semiconductor layers formed on a substrate and having a shift register which enters a normal phase clock signal, a reverse phase clock signal and a start signal, and which shifts the start signal in time with the normal phase clock signal and the reverse phase clock signal, said second motion circuit being composed of polycrystalline silicon semiconductor layers formed on said substrate and having a shift register which enters a normal phase clock signal, a reverse phase clock signal and a start signal, and which shifts the start signal in time with the normal phase clock signal and the reverse phase clock signal, said first motion circuit comprising:

a first latch circuit for latching one of said normal phase clock signal and said reverse phase clock signal having the clock skew therebetween by using a latch pulse signal and for outputting a latched clock signal to said shift register of said first motion circuit, said latch pulse signal being a specific signal for said second motion circuit and having a period equal to or smaller than a period of a latched clock signal;

a second latch circuit for latching an other one of said normal phase clock signal and said reverse phase clock signal having the clock skew therebetween by using said latch pulse signal and for outputting a latched clock signal to said shift register of said first motion circuit; and said first latch circuit and said second latch circuit performing latch operations to be timed to make said normal phase clock signal and said reverse phase clock signal have reverse polarities.

6. The motion circuit of claim 5, wherein said latch pulse signal is a clock signal driving said shift register of said second motion circuit.

7. The motion circuit of claim 5, wherein said latch pulse signal is said start signal entered into said second motion circuit.

8. The motion circuit of claim 5, wherein said latch pulse signal is outputted from one of an in-between stage and a final stage of said second motion circuit.

9. The motion circuit of claim 5, wherein said first motion circuit is provided with a circuit for generating said normal phase clock signal and said reverse phase clock signal from a single phase clock signal entered, for outputting one of said normal phase clock signal and said reverse phase clock signal to said first latch circuit, and for also outputting another one of said normal phase clock signal and said reverse phase clock signal to said second latch circuit.

10. The motion circuit of claim 5, wherein said second motion circuit is composed of single crystalline silicon semiconductor layers formed on a substrate different from said first motion circuit.

11. The motion circuit of claim 10, wherein said latch pulse signal is a clock signal driving said shift register of said second motion circuit.

12. The motion circuit of claim 10, wherein said latch pulse signal is said start signal entered into said second motion circuit.

13. The motion circuit of claim 10, wherein said latch pulse signal is outputted from one of an in-between stage and a final stage of said second motion circuit.

14. The motion circuit of claim 10, wherein said first motion circuit is provided with a circuit for generating said normal phase clock signal and said reverse phase clock signal from a single phase clock signal entered, for outputting one of said normal phase clock signal and said reverse phase clock signal to said first latch circuit, and for also outputting an other one of said normal phase clock signal and said reverse phase clock signal to said second latch circuit.

15. An motion circuit which is composed of polycrystalline silicon semiconductor layers formed on a substrate and which has a shift register entering a normal phase clock signal, a reverse phase clock signal, and a start signal, and shifting the start signal in time with the normal phase clock signal and the reverse phase clock signal, said motion circuit comprising:
   a first inverter chain circuit consisting of a plurality of serially connected inverters, said first inverter chain circuit entering a single phase clock signal to generate a normal phase clock signal having a same phase as said single phase clock signal and outputting said normal phase clock signal to said shift register; and
   a second inverter chain circuit consisting of a different number of serially connected inverters from said first inverter chain circuit by one, said second inverter chain circuit entering a single phase clock signal to generate a reverse phase clock signal which is a reverse of said single phase clock signal and outputting said reverse phase clock signal to said shift register;
   said first inverter chain circuit and said second inverter chain circuit being equal in transistor size of first-stage inverters and in transistor size of final-stage inverters, said first inverter chain circuit and said second inverter chain circuit each having a uniform rate of increase in transistor size between adjacent ones of the serially connected inverters, and said first inverter chain circuit and said second inverter chain circuit having a combination of an even number of inverters and an odd number of inverters to make a minimum delay time.

16. An motion circuit which is composed of polycrystalline silicon semiconductor layers formed on a substrate and which has a shift register entering a normal phase clock signal, a reverse phase clock signal, and a start signal and shifting the start signal in time with the normal phase clock signal and the reverse phase clock signal, said motion circuit comprising:
   an inverter for reversing an entered single phase clock signal and for outputting a reverse phase clock signal to said shift register; and
   a delay circuit for entering said single phase clock signal and for outputting a clock signal having a same phase as said single phase clock signal and being little different in phase from said reverse phase clock signal to said shift register after delaying said clock signal by an established delay time.

17. An motion circuit which is composed of polycrystalline silicon semiconductor layers formed on a substrate and which has a shift register entering a normal phase clock signal, a reverse phase clock signal, and a start signal and shifting the start signal in time with the normal phase clock signal and the reverse phase clock signal, wherein
   all stages composing said shift register are divided into groups and each of said groups comprising:
   a first clock signal supply line for supplying one of said normal phase clock signal and said reverse phase clock signal;
   a second clock signal supply line which branches off from said first clock signal supply line and is provide with an inverter at a midpoint in said second clock signal supply line, said second clock signal supply line supplying an other one of said normal phase clock signal and said reverse phase clock signal;
   first individual connection lines which are a same number as stages contained in each of said groups and which branch off from said first clock signal supply line after a branch point of said second clock signal supply line, said first individual connection lines being each connected to either one of clock signal input terminals of each stage; and
   second individual connection lines which are a same number as stages contained in each of said groups and which branch off from said second clock signal supply line, said second individual connection lines being each connected to an other one of clock signal input terminals of each stage.

18. An motion circuit which is composed of polycrystalline silicon semiconductor layers formed on a substrate and which has a shift register entering a normal phase clock signal, a reverse phase clock signal, and a start signal and shifting the start signal in time with the normal phase clock signal and the reverse phase clock signal, said motion circuit, at each stage of said shift register, comprising:
   a first clock signal supply line for supplying one of said normal phase clock signal and said reverse phase clock signal;
   a second clock signal supply line which branches off from said first clock signal supply line and is provide with an inverter at a midpoint in said second clock signal supply line, said second clock signal supply line supplying an other one of said normal phase clock signal and said reverse phase clock signal.

19. An motion circuit which is composed of polycrystalline silicon semiconductor layers formed on a substrate and which has a logical circuit performing established operations by entering a normal phase clock signal and a reverse phase clock signal having a clock skew therebetween, wherein said logical circuit comprises a means for increasing a maximum clock skew permitted by said logical circuit.

20. The motion circuit of claim 19, wherein said logical circuit is a shift register shifting a start signal entered in time with a normal phase clock signal and a reverse phase clock signal.

21. An motion circuit which is composed of polycrystalline silicon semiconductor layers formed on a substrate and which has a shift register entering a normal phase clock signal and a reverse phase clock signal having a clock skew therebetween and a start signal, and shifting the start signal in time with the normal phase clock signal and the reverse phase clock signal, wherein said register, at least on and after a second stage, comprises:

- a first inverter for entering an output of a previous stage, said first inverter containing a first switching means whose closing and opening is controlled by said normal phase clock signal and said reverse phase clock signal so as to conduct/interrupt an output of said first inverter;
- a second inverter for entering the output of said first inverter and for outputting a reverse signal of the output of said first inverter as an output signal of said shift register;
- a third inverter disposed between an input side and an output side of said second inverter so as to compose a closed circuit in collaboration with said second inverter, said third inverter containing a third switching means whose closing and opening is controlled by said normal phase clock signal and said reverse phase clock signal so as to conduct/interrupt an output of said third inverter; and
- a time constant increase means for increasing time constant defined by an ON resistance of said first switching means and an input capacity of said second inverter within an operation frequencies of said shift register in order to prevent an input potential of said second inverter from reaching a threshold voltage of said second inverter in a skew period.

22. The motion circuit of claim 21, wherein said first switching means is a transfer gate and said time constant increase means is a reduction in transistor size of said transfer gate.

23. The motion circuit of claim 21, wherein said time constant increase means is an increase in said input capacity of said second inverter.

24. The motion circuit of claim 21, wherein said first switching means and said third switching means are transfer gates.

25. The motion circuit of claim 21, wherein said first inverter and said third inverter are clocked inverters.

26. An motion circuit which is composed of polycrystalline silicon semiconductor layers formed on a substrate and which has a shift register entering a normal phase clock signal and a reverse phase clock signal having a clock skew therebetween and a start signal, and shifting the start signal in time with the normal phase clock signal and the reverse phase clock signal, wherein said register, at least on and after a second stage, comprises:

- a first inverter for entering an output of a previous stage, said first inverter containing a first switching means whose closing and opening is controlled by said normal phase clock signal and said reverse phase clock signal so as to conduct/interrupt an output of said first inverter;
- a second inverter for entering the output of said first inverter and for outputting a reverse signal of the output of said first inverter as an output signal of said shift register;
- a third inverter disposed between an input line and an output line of said second inverter so as to compose a closed circuit in collaboration with said second inverter, said third inverter containing a third switching means whose closing and opening is controlled by said normal phase clock signal and said reverse phase clock signal so as to conduct/interrupt an output of said third inverter; and
- a threshold voltage effective value increase means for increasing an effective value of a threshold voltage of said second inverter so as to prevent an input potential of said second inverter from reaching a threshold voltage of said second inverter in a skew period.

27. The motion circuit of claim 26, wherein said first switching means and said third switching means are transfer gates.

28. The motion circuit of claim 26, wherein said first inverter and said third inverter are clocked inverters.

29. The motion circuit of claim 26, wherein said threshold voltage effective value increase means is arrangement of the threshold voltage of transistors composing said second inverter between a power-supply voltage and a ground voltage to be away therefrom.

30. The motion circuit of claim 26, wherein said threshold voltage effective value increase means is provision of a bias element between a source of a P-channel transistor of said second inverter and a power-supply voltage, and another bias element between a source of an N-channel transistor of said second inverter and a grounding voltage.

31. An motion circuit which is composed of polycrystalline silicon semiconductor layers formed on a substrate and which has a shift register entering a normal phase clock signal and a reverse phase clock signal having a clock skew therebetween and a start signal, and shifting the start signal in time with the normal phase clock signal and the reverse phase clock signal, wherein said register is provided with a delay circuit between each adjacent stages.

32. An on-board driver circuit for a liquid crystal display panel comprising a scanning side driver circuit and an image signal side driver circuit which are formed on a same substrate as a liquid crystal unit, wherein each of said scanning side driver circuit and said image signal side driver circuit is composed of said motion circuit of claim 1.

33. An on-board driver circuit for a liquid crystal display panel comprising a scanning side driver circuit and an image signal side driver circuit which are formed on a same substrate as a liquid crystal unit, wherein each of said scanning side driver circuit and said image signal side driver circuit is composed of said motion circuit of claim 19.

34. An on-board driver circuit for a liquid crystal display panel comprising a scanning side driver circuit and an image signal side driver circuit which are formed on a same substrate as a liquid crystal unit, wherein said scanning side driver circuit is composed of said motion circuit of claim 3.

35. An on-board driver circuit for a liquid crystal display panel comprising a scanning side driver circuit and an image signal side driver circuit which are formed on a same substrate as a liquid crystal unit, wherein said image signal side driver circuit is composed of said motion circuit of claim 3.

36. An on-board driver circuit for a liquid crystal display panel comprising a scanning side driver circuit and an image signal side driver circuit which are formed on a same substrate as a liquid crystal unit, wherein said on-board driver circuit comprising said motion circuit of claim 5, and said scanning side driver circuit is composed of said first motion circuit in said motion circuit, and said image signal side driver circuit is composed of said second motion circuit in said motion circuit.

37. An on-board driver circuit for a liquid crystal display panel comprising a scanning side driver circuit and an image signal side driver circuit which are formed on a same substrate as a liquid crystal unit, wherein said on-board driver circuit comprising said motion circuit of claim 10, and said scanning side driver circuit is composed of said first motion circuit in said motion circuit, and said image signal side driver circuit is composed of said second motion circuit in said motion circuit.

38. An on-board driver circuit for a liquid crystal display panel comprising a scanning side driver circuit and an image signal side driver circuit which are formed on a same substrate as a liquid crystal unit, wherein said scanning side driver circuit is composed of said motion circuit of claim 15.

39. An on-board driver circuit for a liquid crystal display panel comprising a scanning side driver circuit and an image signal side driver circuit which are formed on a same substrate as a liquid crystal unit, wherein said scanning side driver circuit is composed of said motion circuit of claim 16.

40. An on-board driver circuit for a liquid crystal display panel comprising a scanning side driver circuit and an image signal side driver circuit which are formed on a same substrate as a liquid crystal unit, wherein said scanning side driver circuit is composed of said motion circuit of claim 17.

41. An on-board driver circuit for a liquid crystal display panel comprising a scanning side driver circuit and an image signal side driver circuit which are formed on a same substrate as a liquid crystal unit, wherein said scanning side driver circuit is composed of said motion circuit of claim 21.

42. An on-board driver circuit for a liquid crystal display panel comprising a scanning side driver circuit and an image signal side driver circuit which are formed on a same substrate as a liquid crystal unit, wherein said scanning side driver circuit is composed of said motion circuit of claim 26.

43. An on-board driver circuit for a liquid crystal display panel comprising a scanning side driver circuit and an image signal side driver circuit which are formed on a same substrate as a liquid crystal unit, wherein said scanning side driver circuit is composed of said motion circuit of claim 31.

44. An on-board driver circuit for a liquid crystal display panel comprising a scanning side driver circuit and an image signal side driver circuit which are formed on a same substrate as a liquid crystal unit, wherein said image signal side driver circuit is composed of said motion circuit of claim 15.

45. An on-board driver circuit for a liquid crystal display panel comprising a scanning side driver circuit and an image signal side driver circuit which are formed on a same substrate as a liquid crystal unit, wherein said image signal side driver circuit is composed of said motion circuit of claim 16.

46. An on-board driver circuit for a liquid crystal display panel comprising a scanning side driver circuit and an image signal side driver circuit which are formed on a same substrate as a liquid crystal unit, wherein said image signal side driver circuit is composed of said motion circuit of claim 17.

47. An on-board driver circuit for a liquid crystal display panel comprising a scanning side driver circuit and an image signal side driver circuit which are formed on a same substrate as a liquid crystal unit, wherein said image signal side driver circuit is composed of said motion circuit of claim 21.

48. An on-board driver circuit for a liquid crystal display panel comprising a scanning side driver circuit and an image signal side driver circuit which are formed on a same substrate as a liquid crystal unit, wherein said image signal side driver circuit is composed of said motion circuit of claim 26.

49. An on-board driver circuit for a liquid crystal display panel comprising a scanning side driver circuit and an image signal side driver circuit which are formed on a same substrate as a liquid crystal unit, wherein said image signal side driver circuit is composed of said motion circuit of claim 31.

\* \* \* \* \*